(12) United States Patent  (10) Patent No.: US 7,409,120 B2
Taylor et al.  (45) Date of Patent: Aug. 5, 2008

(54) INTEGRATED CIRCUIT FOR PROGRAMMABLE OPTICAL DELAY

(75) Inventors: Geoff W. Taylor, Storrs-Mansfield, CT (US); Jianhong Cai, Nashua, NH (US); Daniel C. Upp, Southbury, CT (US)

(73) Assignees: The University of Connecticut, Farmington, CT (US); Opel, Inc., Shelton, CT (US)

( * ) Notice: Subject to any disclaimer, the term of this patent is extended or adjusted under 35 U.S.C. 154(b) by 0 days.

(21) Appl. No.: 11/424,012

(22) Filed: Jun. 14, 2006

(65) Prior Publication Data

US 2007/0019900 A1  Jan. 25, 2007

Related U.S. Application Data

(62) Division of application No. 10/602,217, filed on Jun. 24, 2003, now Pat. No. 7,064,697.

(60) Provisional application No. 60/443,435, filed on Jan. 29, 2003.

(51) Int. Cl.
  *G02B 6/12* (2006.01)
(52) U.S. Cl. ...................................... 385/14
(58) Field of Classification Search ........................ None
  See application file for complete search history.

(56) References Cited

U.S. PATENT DOCUMENTS 5,222,162 A * 6/1993 Yap et al. ....................... 385/14
5,565,867 A  10/1996 Tiemann
6,031,243 A   2/2000 Taylor
6,094,458 A   7/2000 Hellberg 6,781,533 B2  8/2004 Yap et al.
2002/0150368 A1  10/2002 Imoto

FOREIGN PATENT DOCUMENTS

JP  03109528 A * 5/1991

(Continued)

OTHER PUBLICATIONS

"Analog-to-Digital Converter Architectures and Choices for System Design"; by Brian Black, Analog Dialogue 33-8 (1999).

(Continued)

*Primary Examiner*—Sung H Pak
(74) *Attorney, Agent, or Firm*—Gordon & Jacobson, PC

(57) ABSTRACT

Interference caused by the propagation of a transmit signal transmitted from a transmit antenna to a receive antenna is effectively cancelled by an improved signal cancellation system. The system includes an interference cancellation signal generator that generates a time-delayed and amplitude-reduced representation of said transmit signal. A summing stage is operably coupled to the interference cancellation signal generator and the receive antenna. The summing stage subtracts the time-delayed and amplitude-reduced representation of the transmit signal from a receive signal to substantially cancel the interference. The interference cancellation signal generator preferably includes a novel programmable optical delay line that introduces a variable amount of optical delay to an optical signal derived from said transmit signal in addition to a thyristor-based sigma delta modulator that converts samples of the transmit signal to into a digital signal in the optical domain.

10 Claims, 26 Drawing Sheets

FOREIGN PATENT DOCUMENTS

WO     WO 02/071490     9/2002
WO     WO 2004/038812     5/2004

OTHER PUBLICATIONS

"A Brief Introduction to Sigma Delta Conversion", by David Jarman, Intersil Publication, May 1995.

"Polymer-Based Optical Waveguid Circuits for Photonic Phased Array Antennas" by Sunning Tang, L. Wu, Z. Fu, D. An, Z. Han, and Ray T. Chen; Jan. 1999; Part of the SPIE Conference on Optoelectronic Interconnects VI.

"High Resolution Signal Conditioning ADC's" by Walt Kester, James Bryant, and Joe Buxton, 1996.

"Synthesis and Analysis of Sigma-Delta Modulators Employing Continuous-Time filters" by Philippe Benabes, Mansour Keramat, and Richard Kielbasa, Analog Integrated Circuits and Signal Processing, May 2000.

Optical Components for WDM Lightwave Networks M.S. Borella,J. P. Jue, D.Banerjee, B.Ramamurthy and B. Mukherjee, Proceedings of the IEEE, vol. 85 No. 8, pp. 1274-1307 Aug. 1997.

Integrated Inversion Channel Optoelectroic Devices and Circuit Elements for Multifunctional Array Applications G.W. Taylor et al., IEEE Journal of Quantum Electronics, vol. 29 No. 2, Feb. 1993.

"Three-Terminal Operation of the Double-Heterostructure Optoelectroic Switching Laser", G.W. Taylor, P.R. Claisse, P. Cooke, AT&T Laboratories, Mar. 30, 1991.

"A Quantum-Well Inversion Channel Heterostructure as a Multifunctional Component for Optoelectronic Integrated Circuits", Sargood, Taylor, Claisse, Vang, Cooke, Doctor, Kiely, Burrus, IEEE 1993.

"Demonstration of an Optoelectronic 4-bit Analog-to-Digital Converter Using a Thyristor Smart Comparator", J. Cai, G.W. Taylor, Optics Communications, Oct. 1, 2000, pp. 79-88.

"Monolithic Integration of Lasers with FET and Bipolar Transistors in Inversion Channel Technology", A. Evaldsson, T.A. Vang, G.W. Taylor, P.A. Evaldsson, and P. Cooke, Electronic Letters, Jan. 1993, pp. 60-62.

"Small Signal Model and High-Frequency Performance of the BICFET", G.W. Taylor, John G. Simmons, Nov. 1985 IEEE.

"Heterostructure field-effect transistor optical mudulator in the InGaAs/A1GaAs material system", Applied Physics Letters, Nov. 16, 1992.

\* cited by examiner

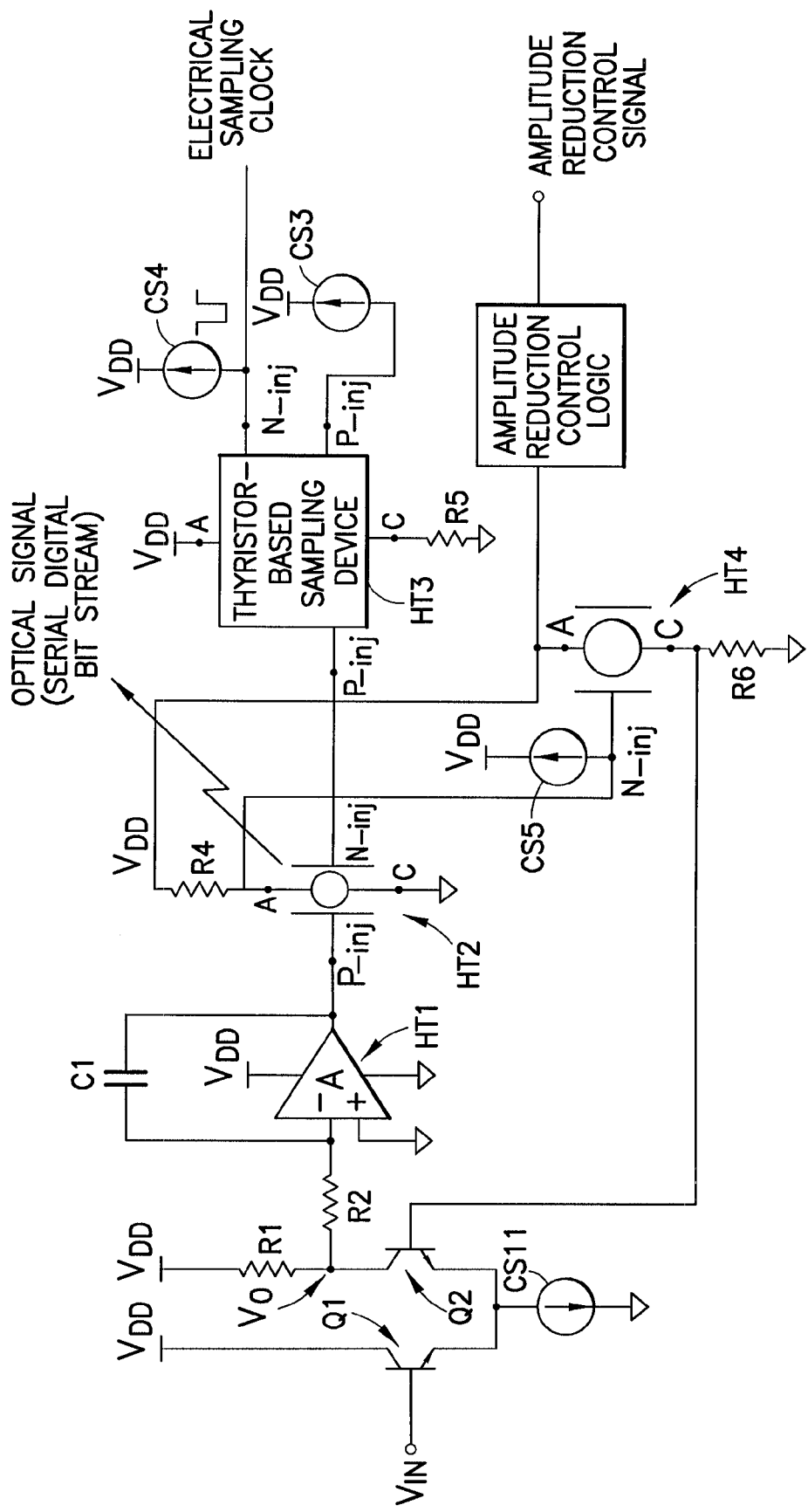
FIG.3B1

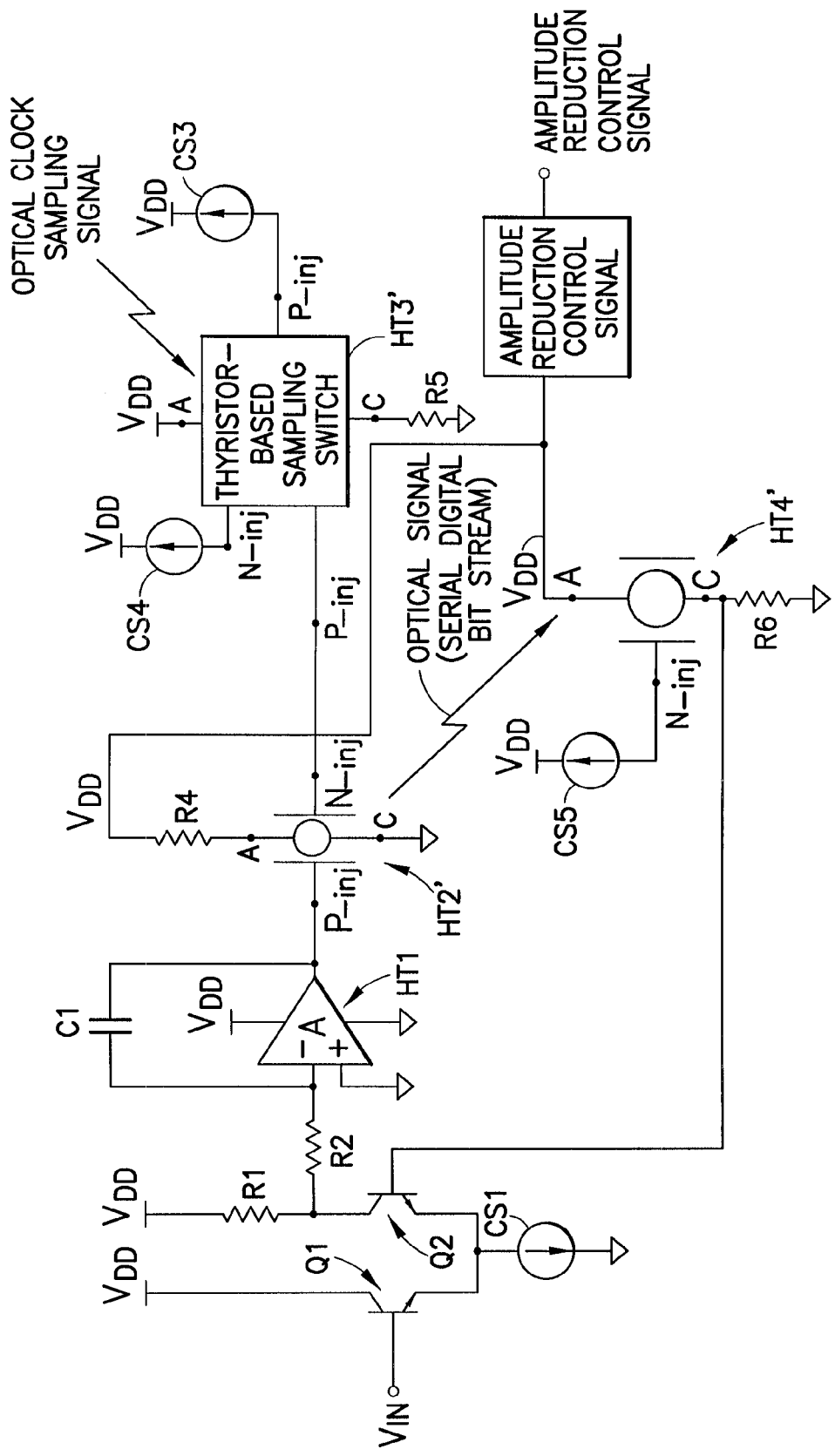
FIG.3B2

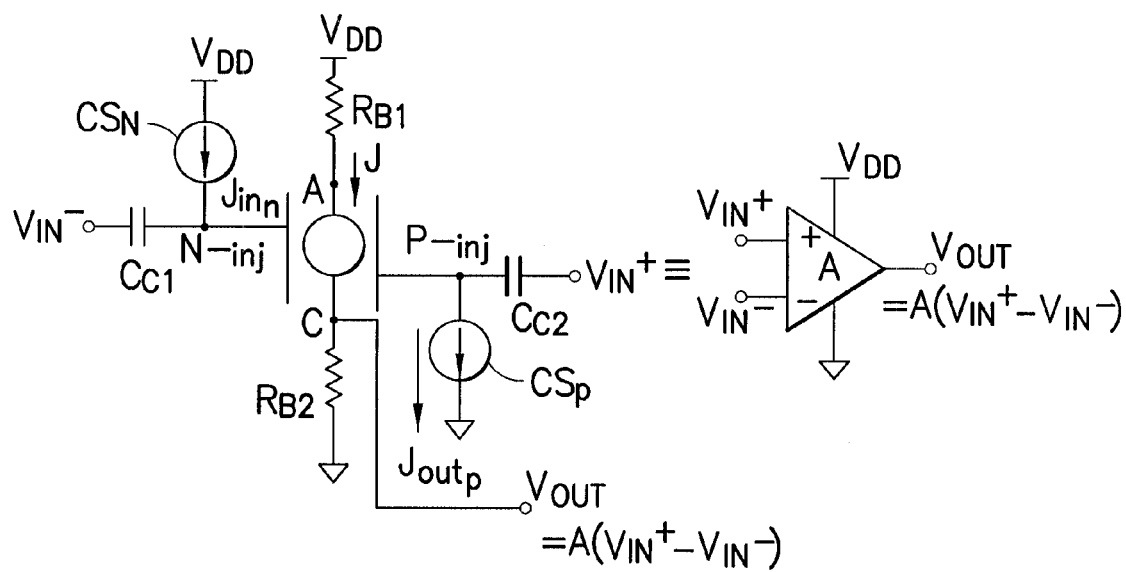
FIG.3C1

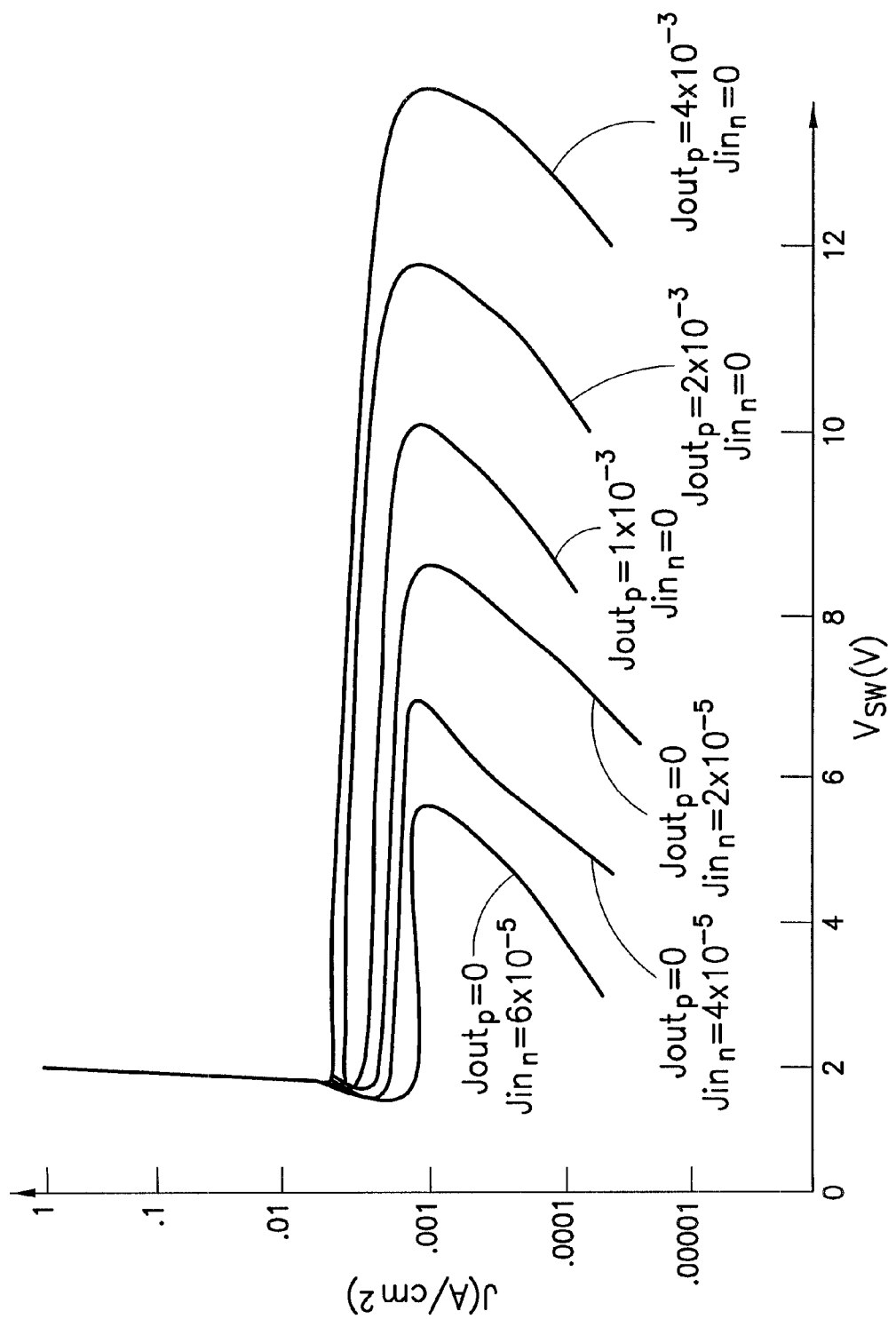
FIG.3C2

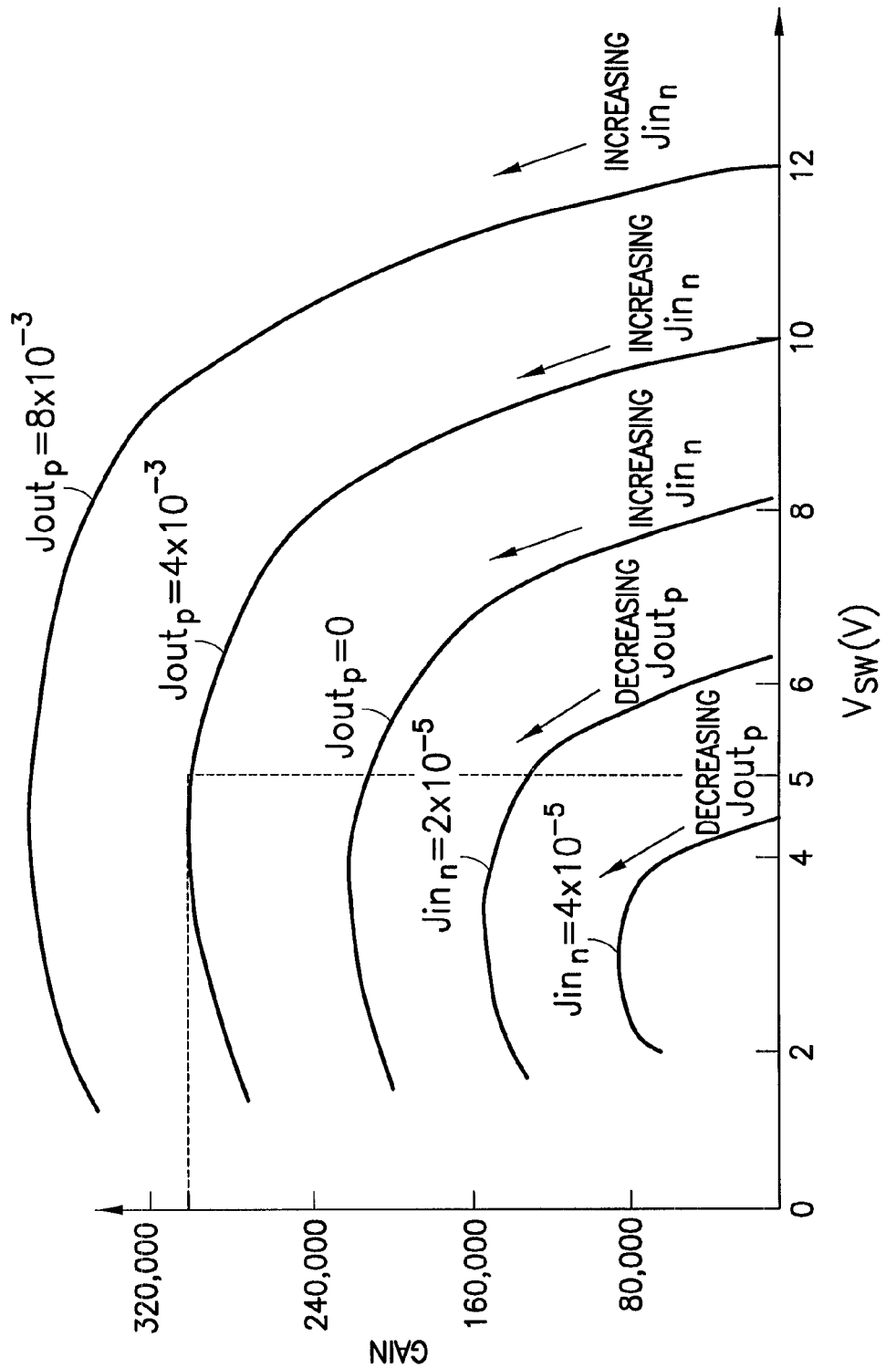
FIG. 3C3

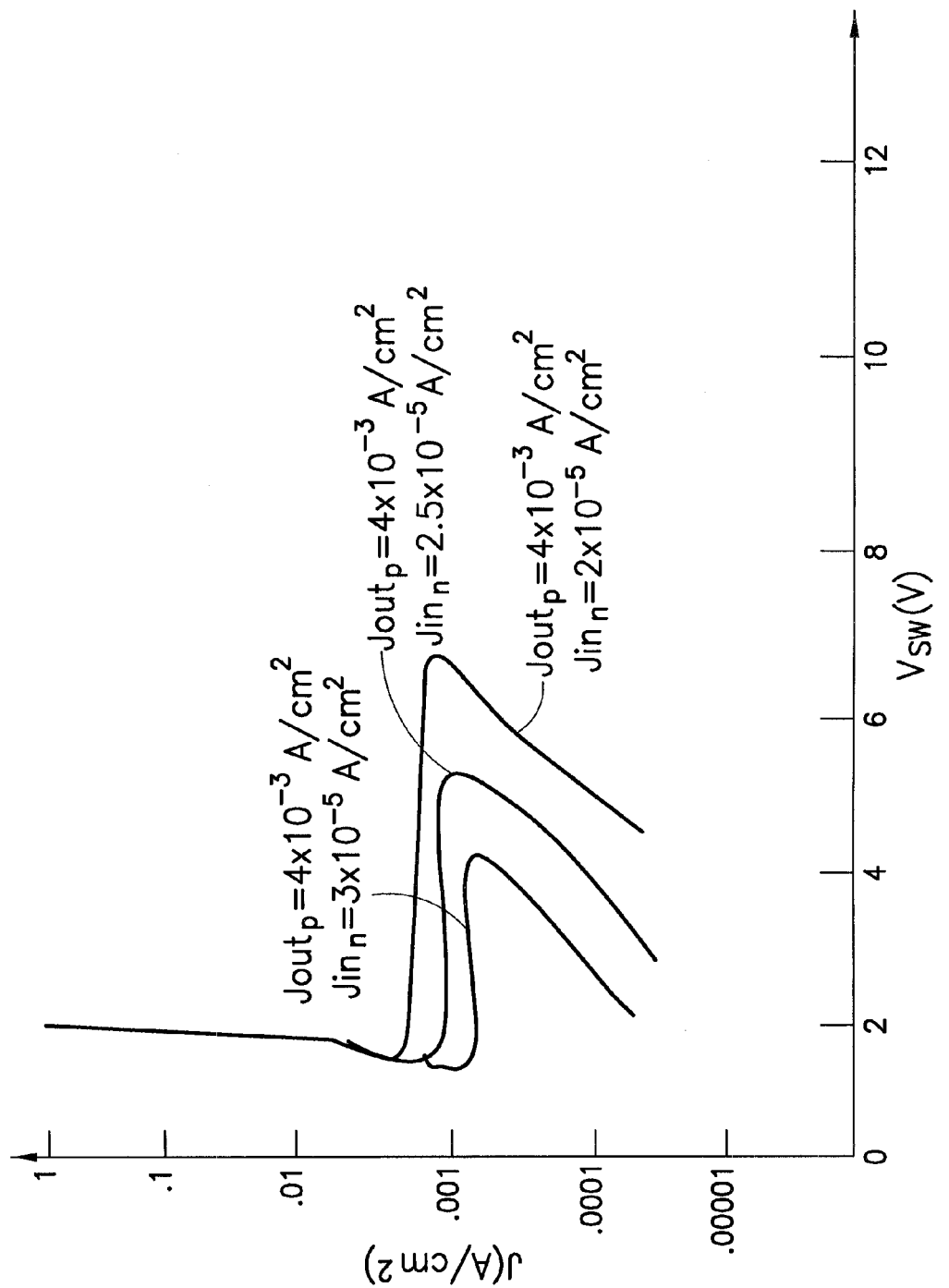
FIG.3C4

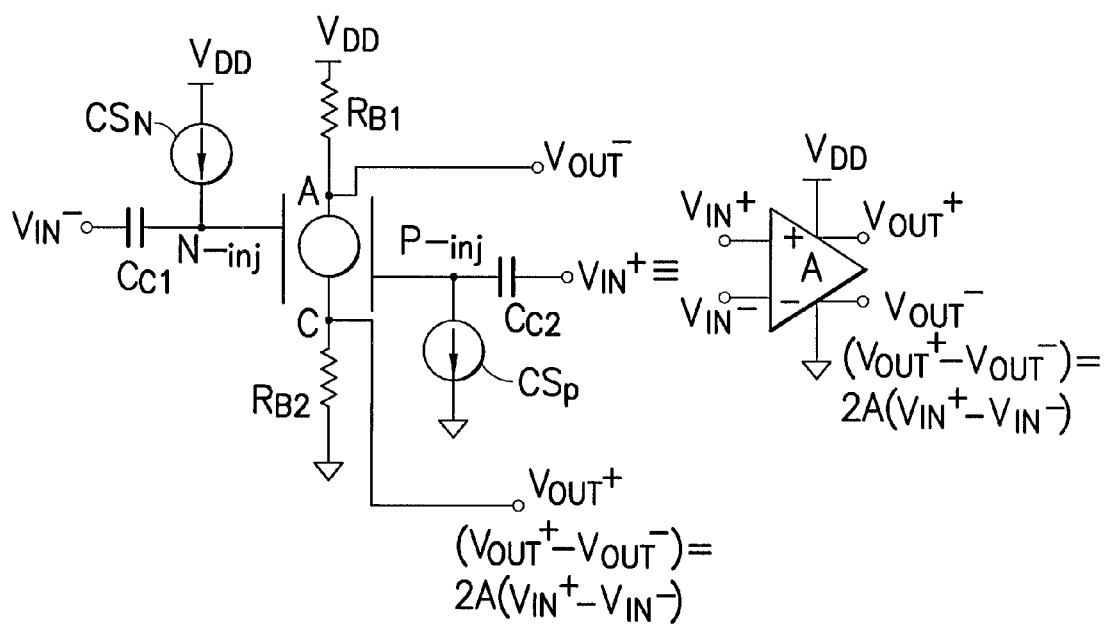
FIG.3C5

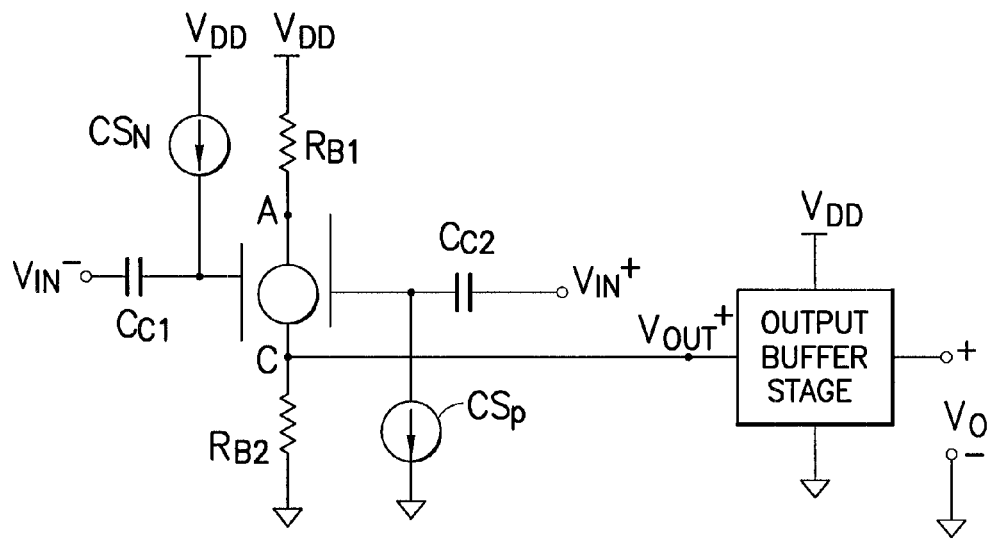
WHERE $V_O \approx -A(V_{IN}^+ - V_{IN}^-)$
FIG. 3C6
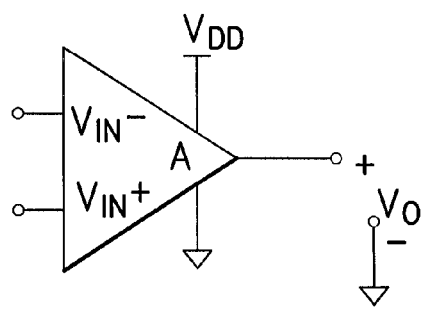
WHERE $V_O \approx -A(V_{IN}^+ - V_{IN}^-)$
FIG. 3C7

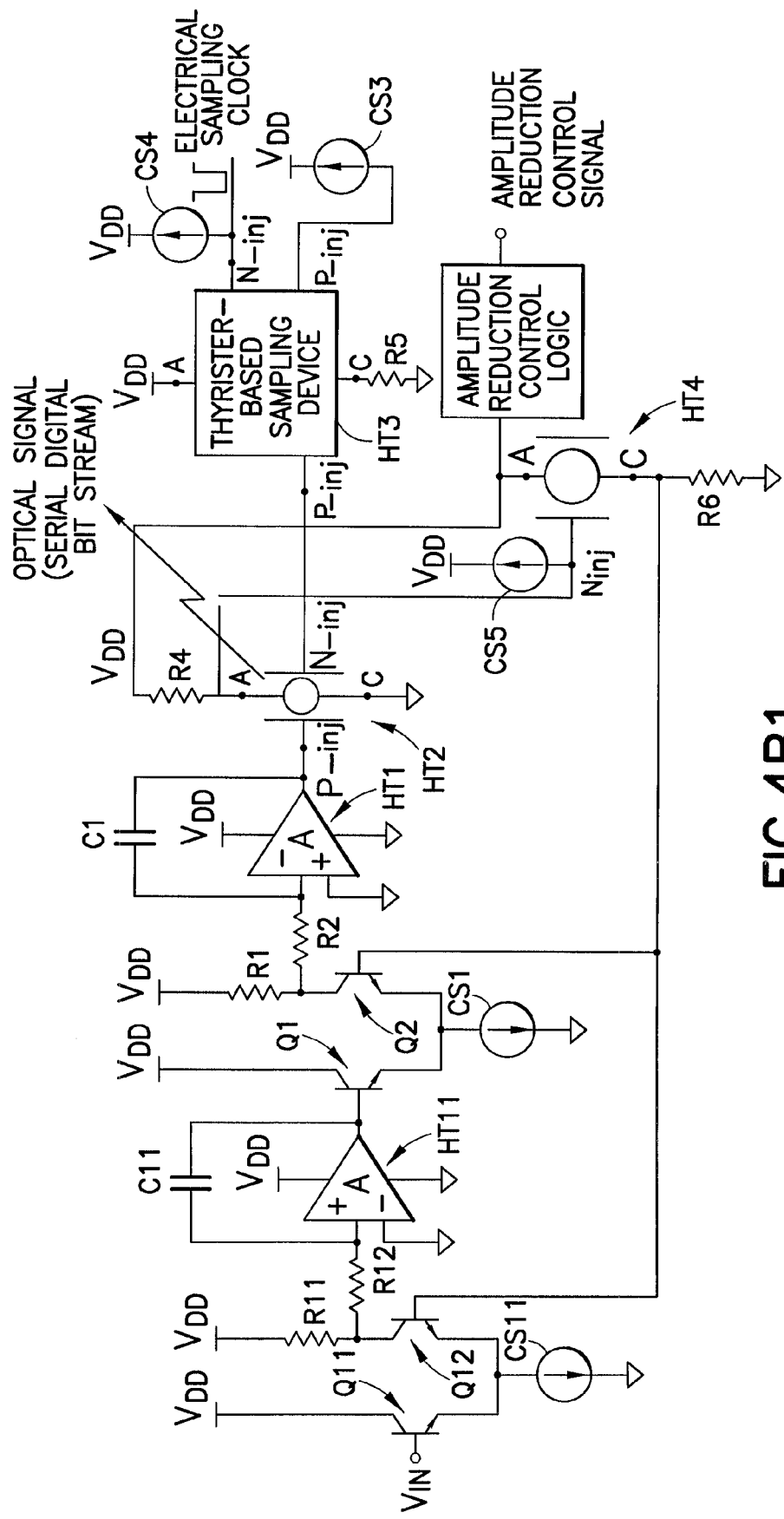
FIG.4B1

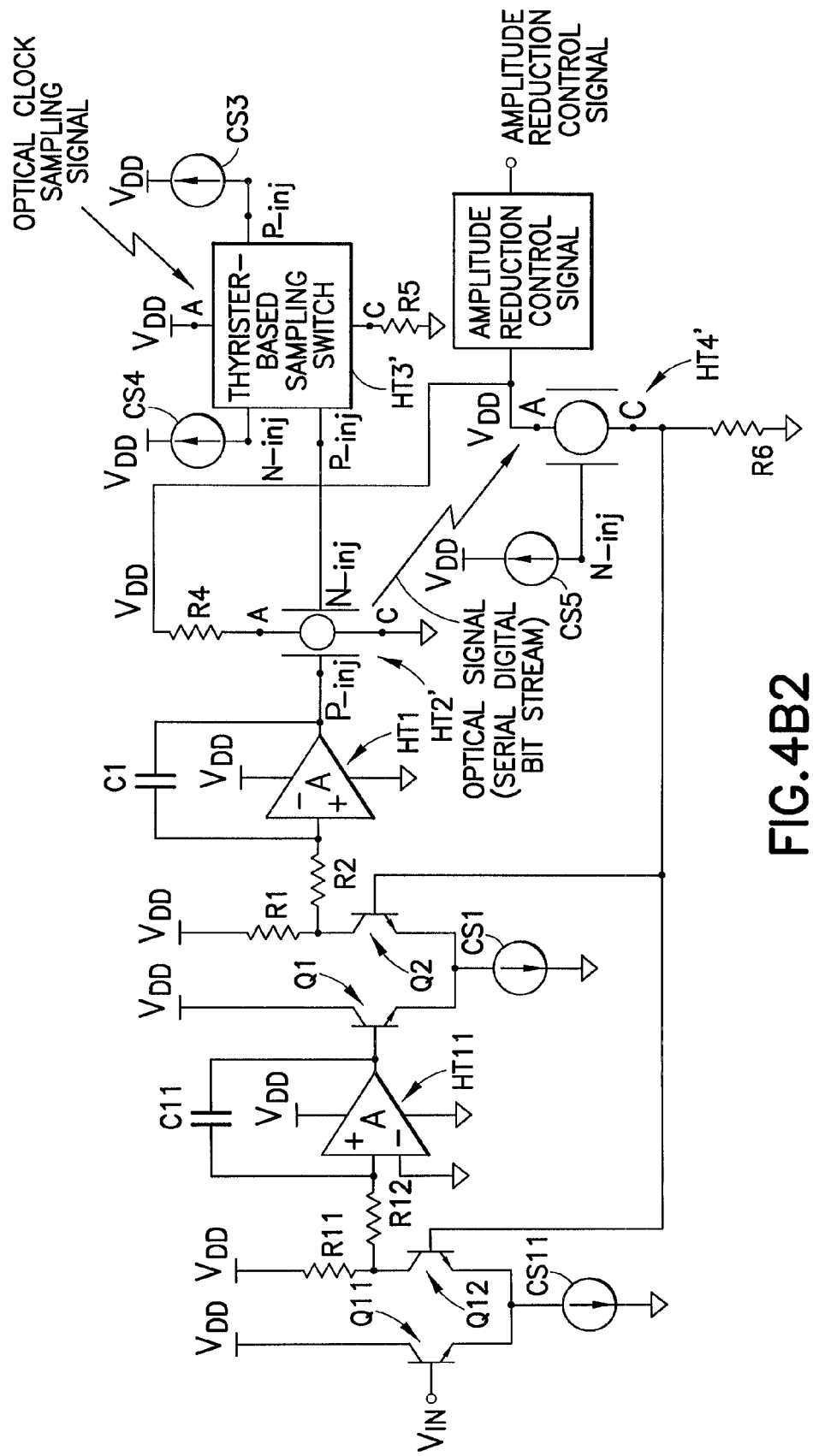
FIG.4B2

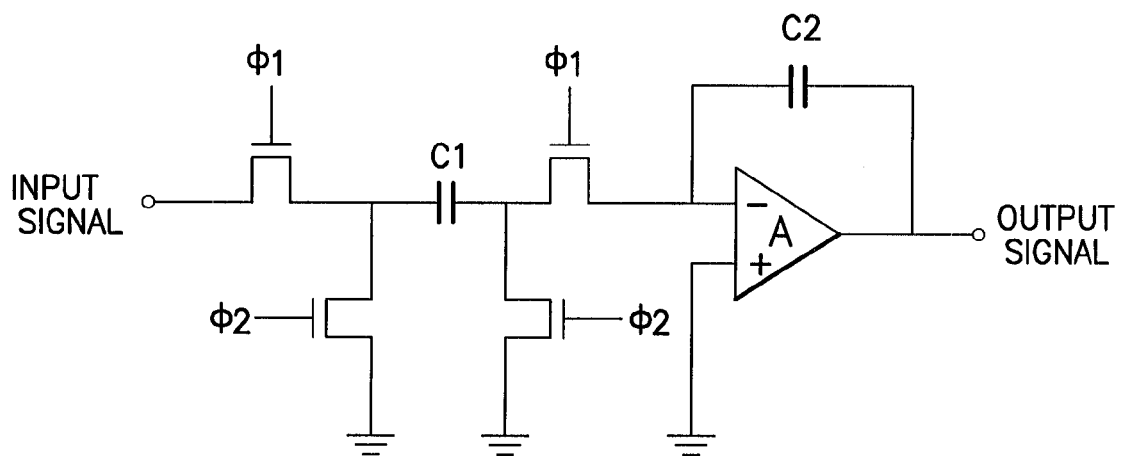
FIG.4B3

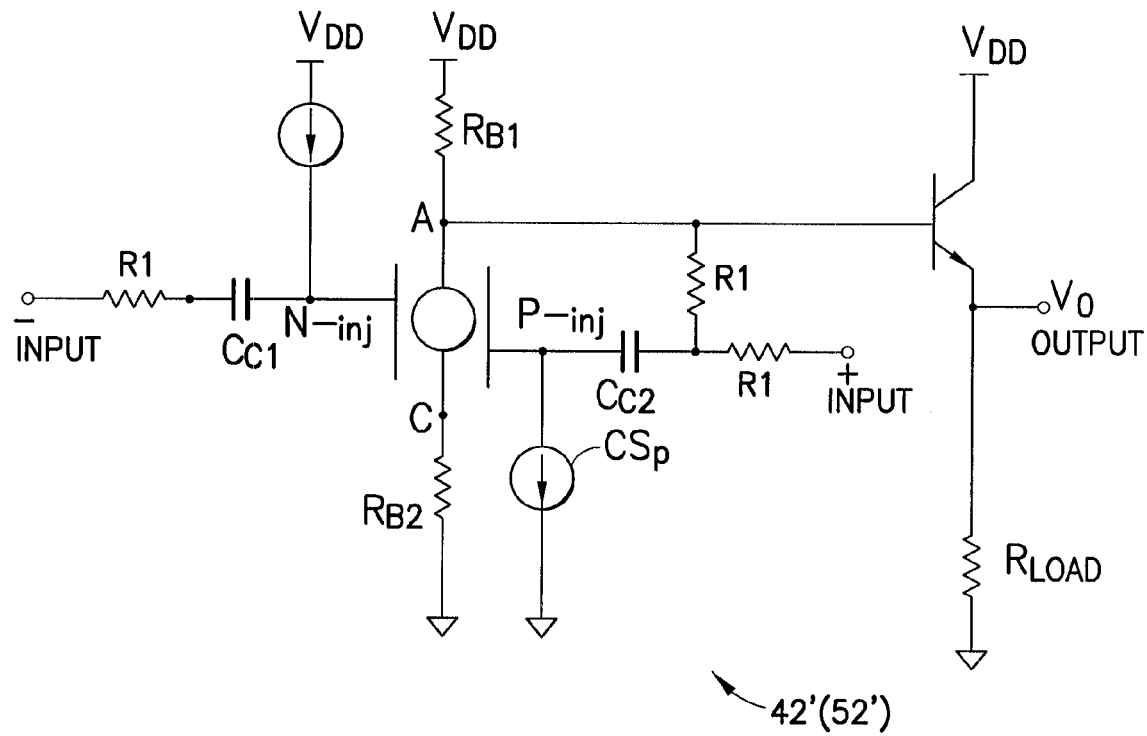
FIG.4B4
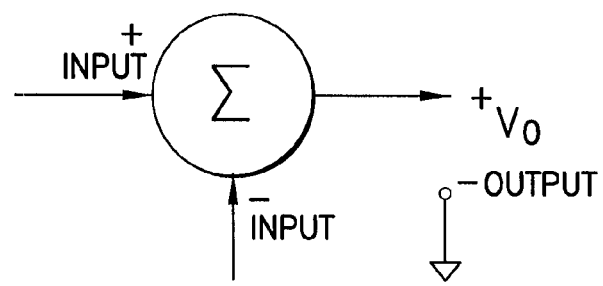
FIG.4B5

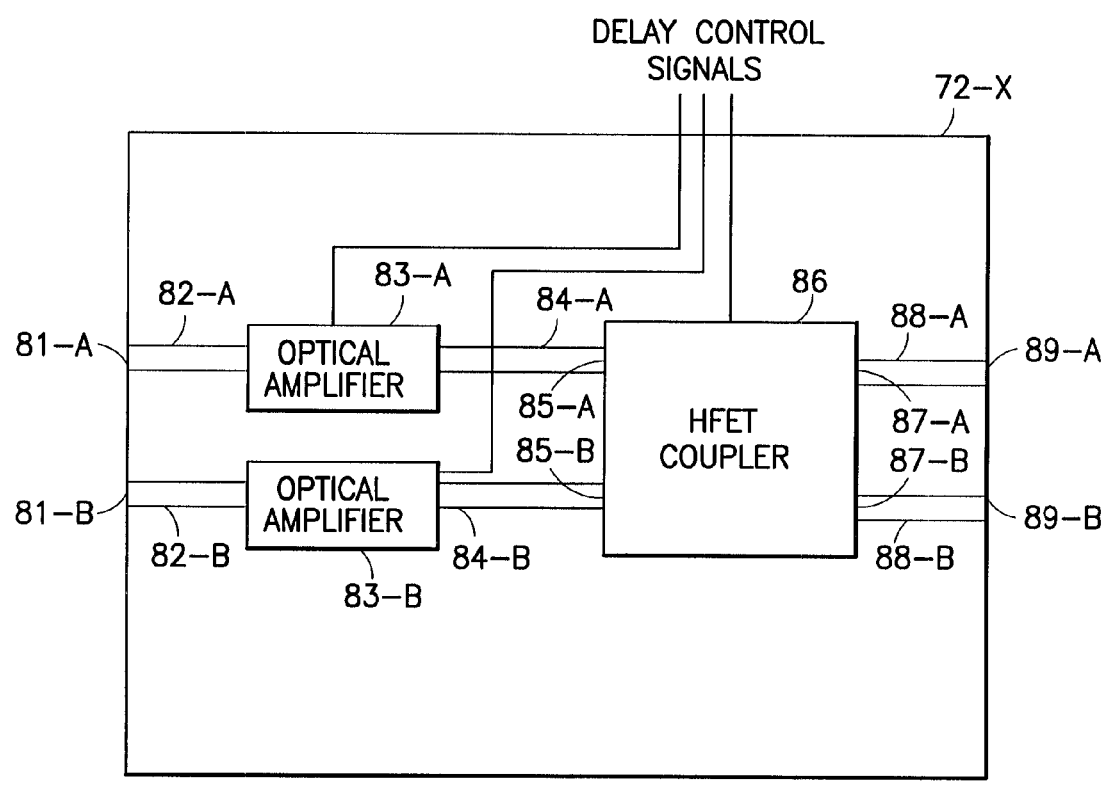
FIG.5B1

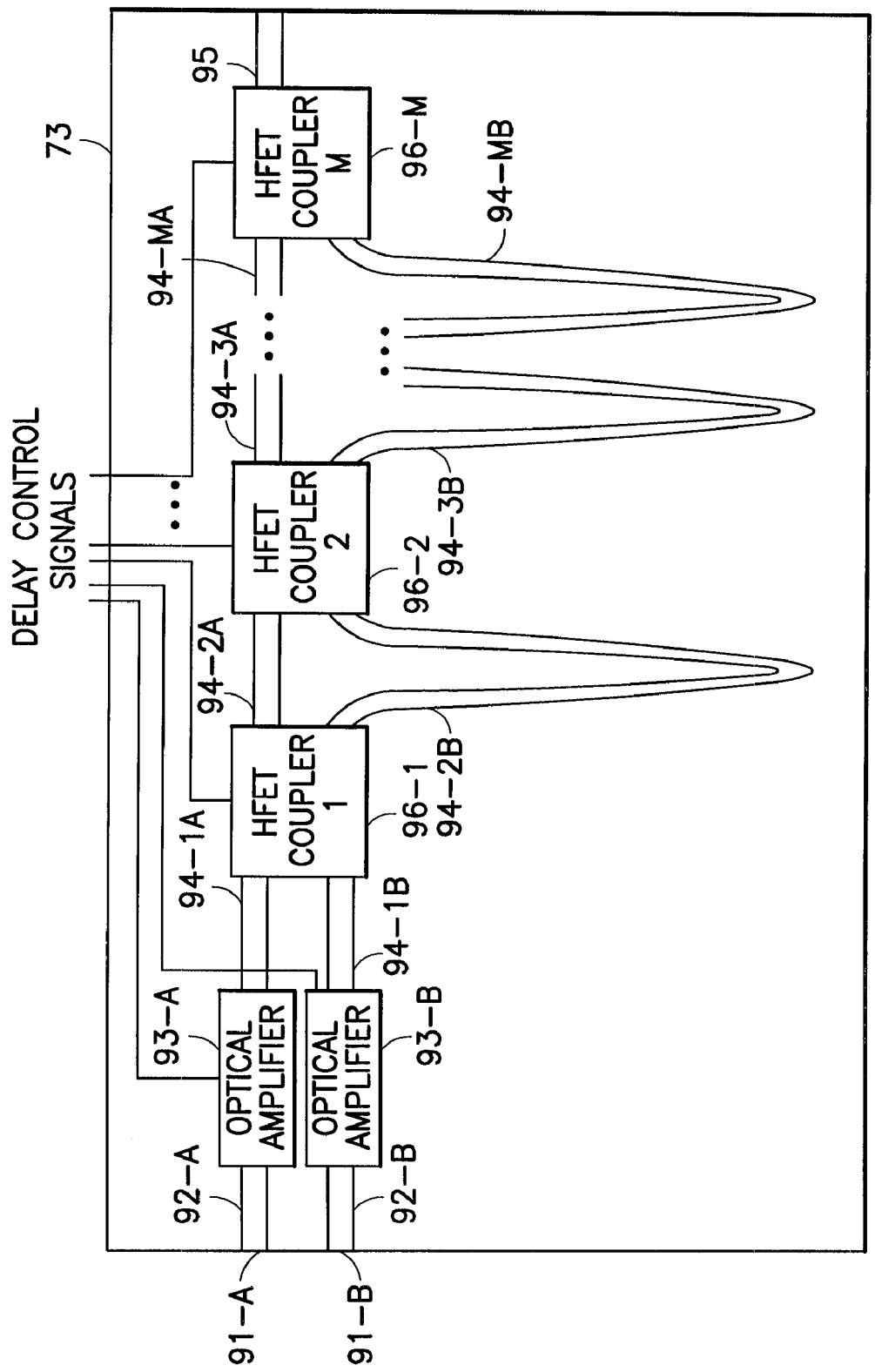
FIG.5B2

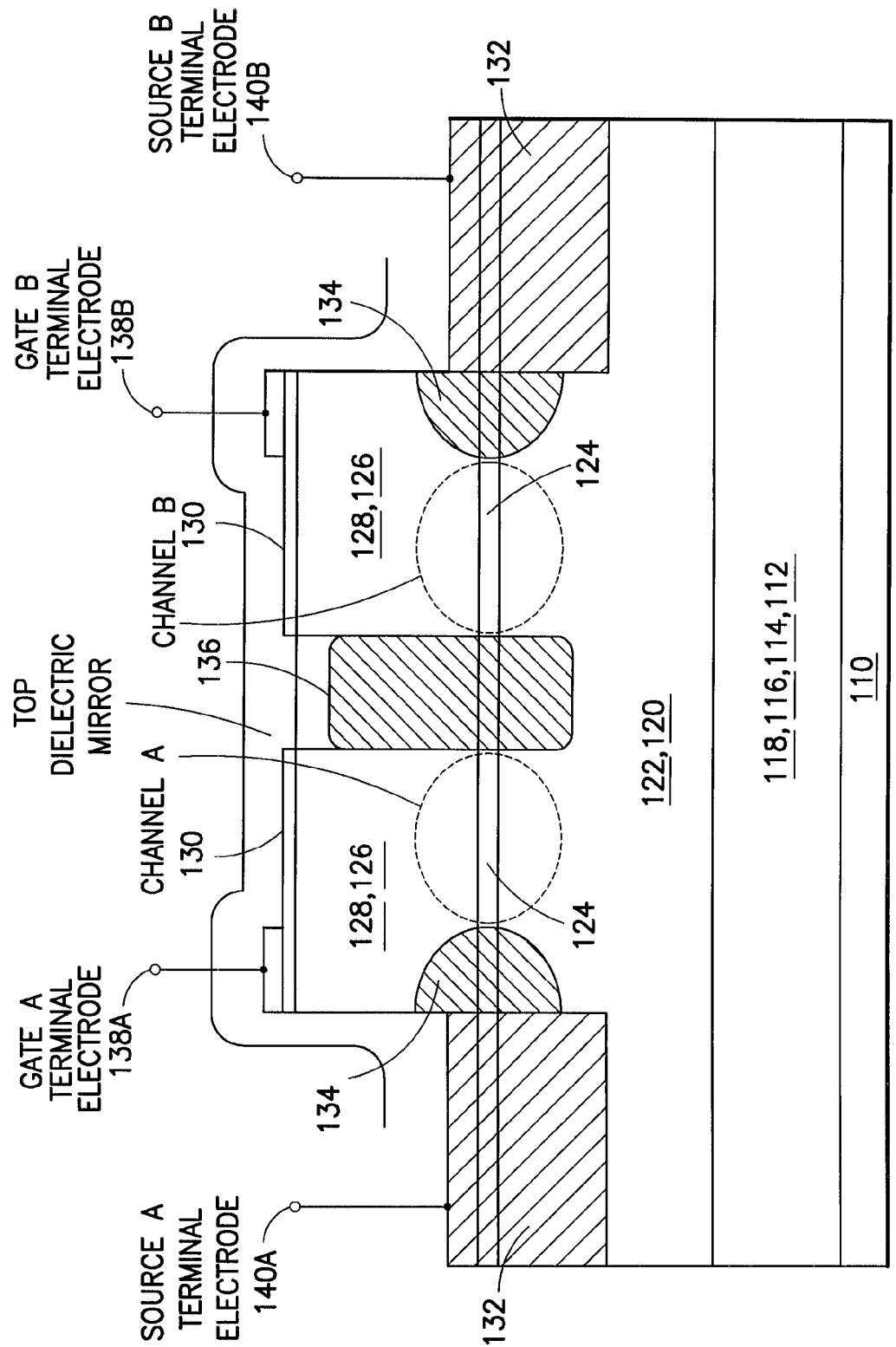
FIG.5C1

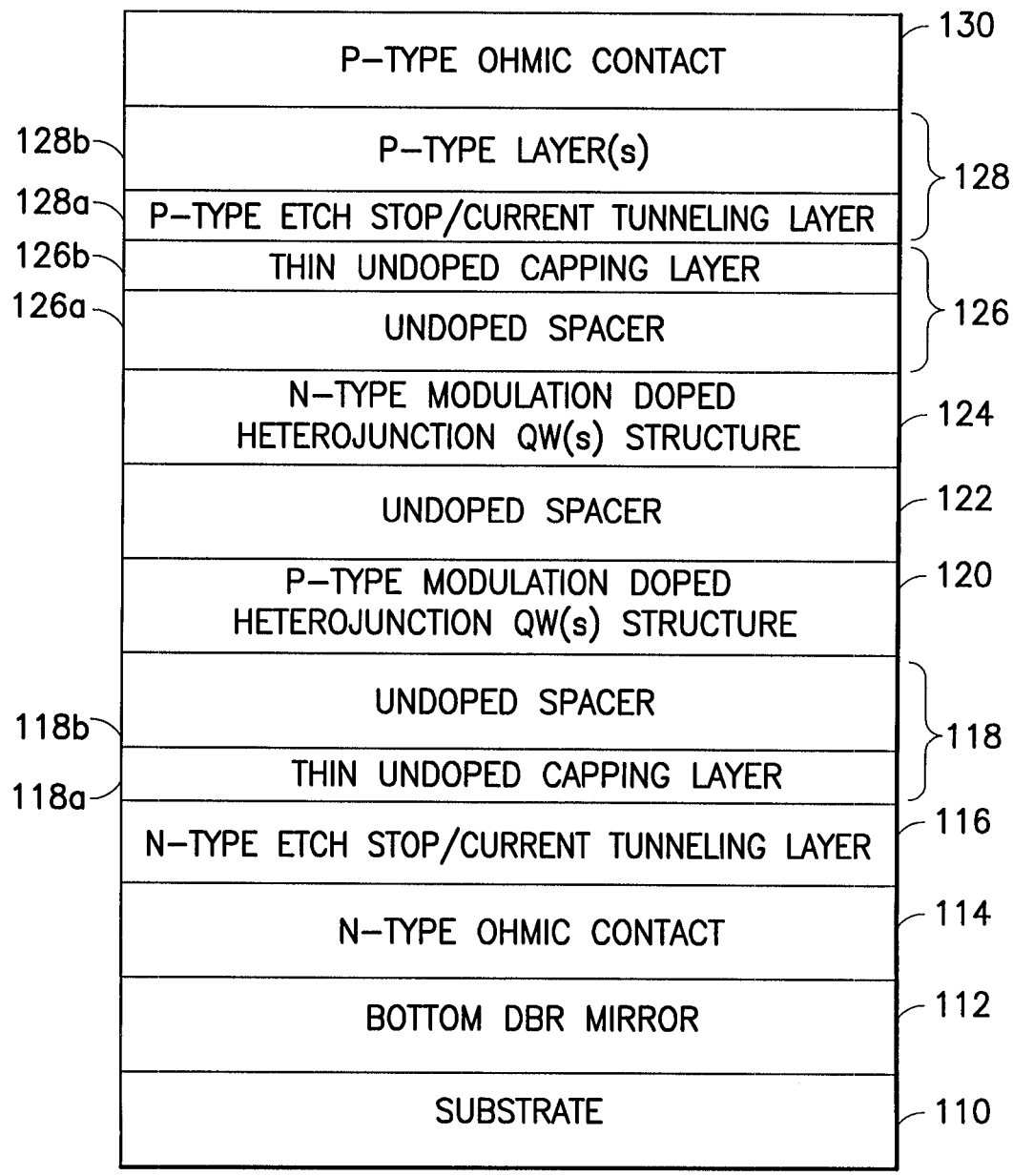
FIG.5C2

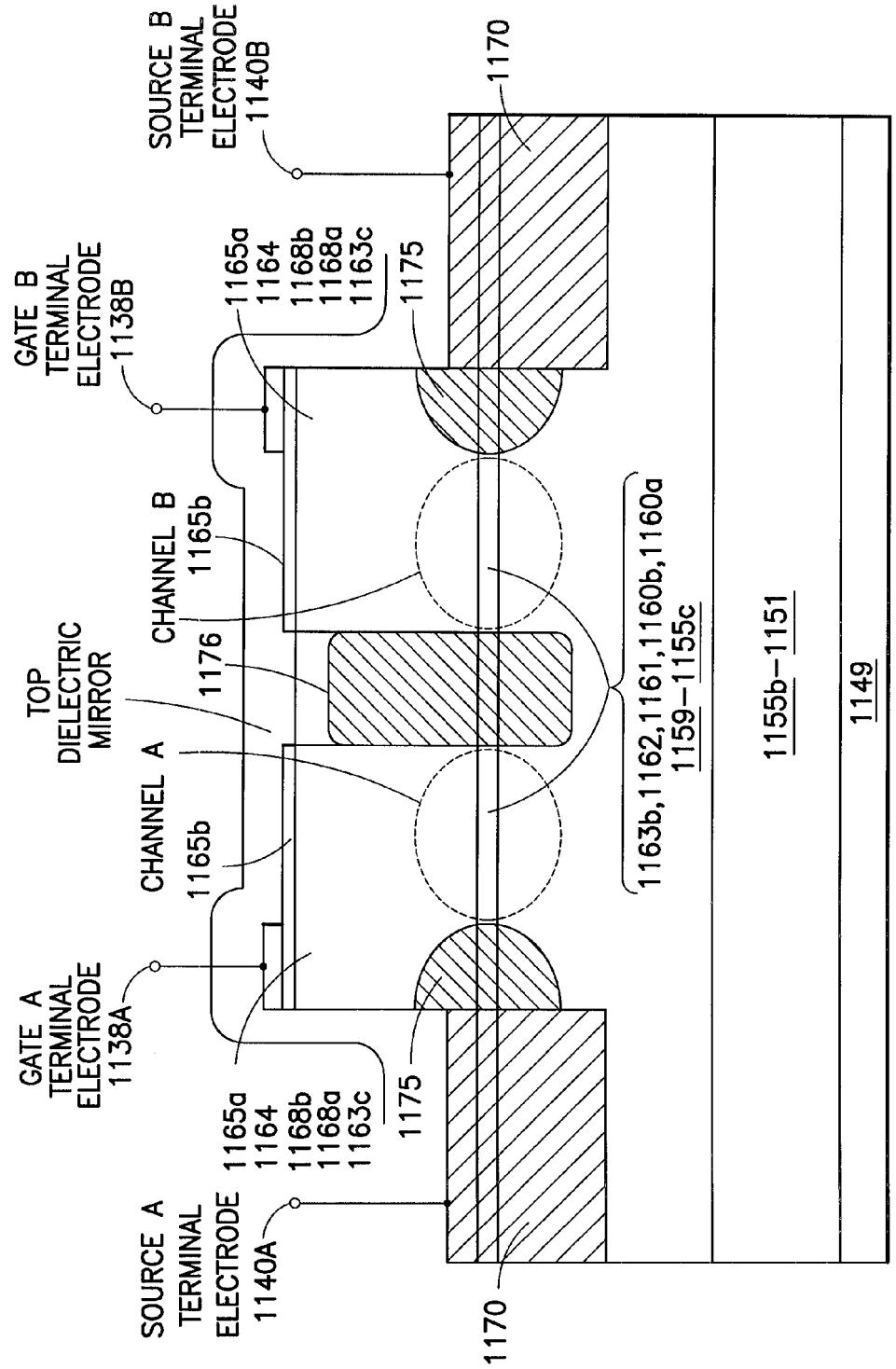
FIG. 5D1

| LAYER MATERIAL | LAYER DOPING TYPE | TYPICAL DOPING CONCENTRATION (atoms/cm$^{+3}$) | TYPICAL LAYER THICKNESS(Å) | LAYER # | |
|---|---|---|---|---|---|
| InGaAs | P+ | 1E20 | 25 | 1165b | ⎫ 130 |
| GaAs | P+ | 1E20 | 75 | 1165a | ⎭ |
| GaAs | P | 1-5E17 | 300 | 1164 | ⎫ 128 |
| AlAs | P+ | 3.5E18 | >20,<300 | 1168b | ⎭ |
| GaAs | und | und | >6,<20 | 1168a | ⎫ 126 |
| Al.15Ga.85As | und | und | 200-300 | 1163c | ⎭ |
| Al.15Ga.85As | N+ | 3.5E18 | 80 | 1163b | ⎫ |
| Al.15Ga.85As | und | und | 20-30 | 1163a | |
| GaAs | und | und | 15 | 1162 | |
| In.15Ga.85AsN ⎫x3 | und | und | 60 | 1161 | 124 |
| GaAs ⎭ | und | und | 100 | 1160b | |
| GaAs | und | und | 100-250 | 1160a | ⎭ |
| Al.15Ga.85As | und | und | 5000 | 1159 | ⎫ 122 |
| GaAs | und | und | 250-500 | 1167 | ⎭ |
| GaAs ⎫x3 | und | und | 100 | 1158 | ⎫ |
| In.15Ga.85AsN ⎭ | und | und | 60 | 1157 | |
| GaAs | und | und | 15 | 1156 | 120 |
| Al.15Ga.85As | und | und | 30 | 1155d | |
| Al.15Ga.85As | P+ | 3.5E18 | 80 | 1155c | ⎭ |
| Al.15Ga.85As | und | und | 200-300 | 1155b | ⎫ 118 |
| GaAs | und | und | >6,<20 | 1166b | ⎭ |
| AlAs | N+ | 3.5E18 | >30,<200 | 1166a | 116 |
| GaAs | N+ | 3.5E18 | 1000-2000 | 1153 | 114 |
| AlAs | und | und | 1701 | 1151 | ⎫ |
| GaAs ⎫x7 | und | und | 696 | 1152 | 112 |
| AlAs ⎭ | und | und | 1701 | 1151 | ⎭ |
| GaAs SUBSTRATE | | SI | | 1149 | 110 |

FIG.5D2

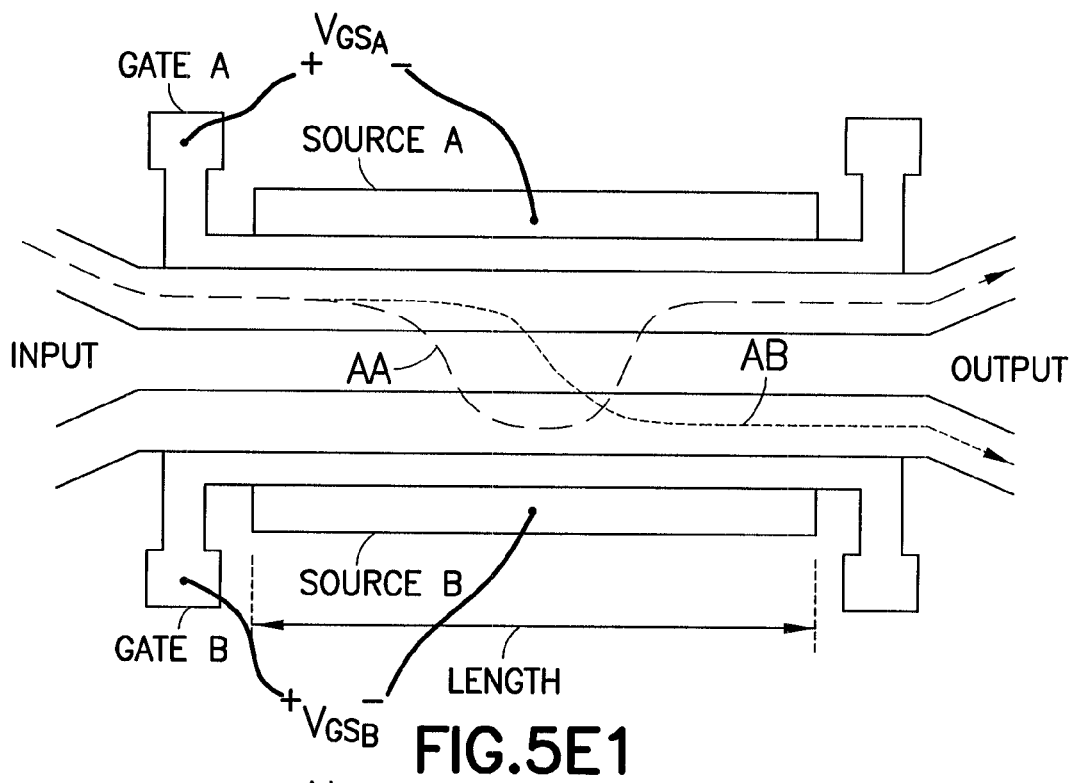
FIG.5E1
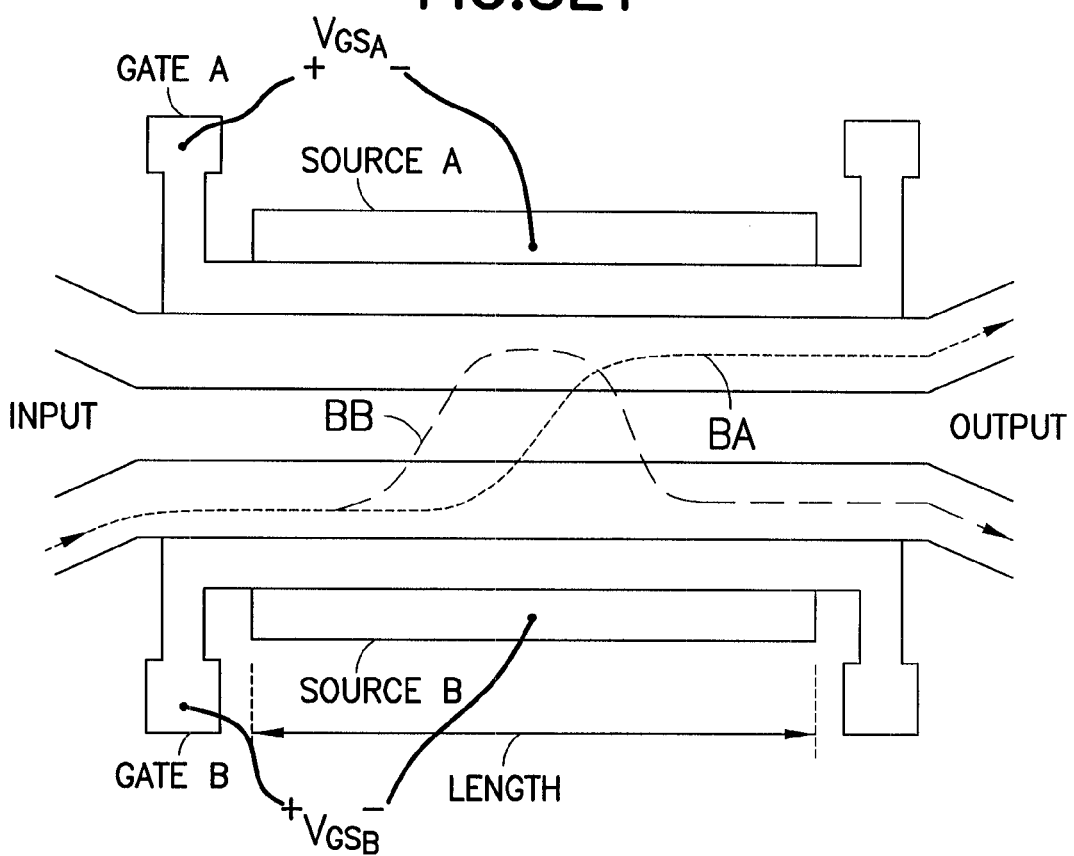
FIG.5E2

INTEGRATED CIRCUIT FOR PROGRAMMABLE OPTICAL DELAY

CROSS-REFERENCE TO RELATED APPLICATIONS

This application is a divisional of U.S. Ser. No. 10/602,217, filed Jun. 24, 2003, now U.S. Pat. No. 7,064,697 which is a continuation-in-part of U.S. Application No. 60/443,435 filed on Jan. 29, 2003, and is related to U.S. application Ser. No. 10/602,218, filed Jun. 24, 2003, now issued as U.S. Pat. No. 6,841,806, each application commonly assigned to assignee of the present invention and herein incorporated by reference in its entirety.

The U.S. Government has a paid-up license in this invention and the right in limited circumstances to require the patent owner to license others on reasonable terms as provided for by the terms of Agreement No. F33615-02-M-4024 awarded by the Air Force Research Laboratory.

BACKGROUND OF THE INVENTION

1. Field of the Invention

This invention relates to communication systems and to optical and electronic signal processing elements that embodied in such communication systems.

2. State of the Art

Modern communication systems, such as phased-array communication systems, employ transmit and receive modules that are located nearby one another. In this configuration, the operation of the receive module may be interfered with by an overwhelming interference signal radiating from a nearby transmitter, thereby limiting the dynamic range of the system. For example, modern aircraft communication systems typically employ a number of radios which need to be operated simultaneously and in full duplex mode. Interference levels can be controlled by adjusting antenna spacing, frequency separation, transmitter power and specific signal delays. Such systems have been designed and built with operating frequencies from 2 MHz to 12.4 GHz with interference levels ranging from μwatts to watts.

Interference cancellation systems have been developed to further mitigate the effects of the interference signal radiating from the transmitter. A high level functional block diagram of an interference cancellation system (ICS) 10 is shown in FIG. 1. The transmitter 12 generates a transmit signal that is supplied to a transmitter antenna 14. The signal emanating from the transmitting antenna 14 is reduced in amplitude and delayed in time as it propagates away from the transmitting antenna. The reduction in amplitude is essentially proportional to $1/R^2$, where R is the distance between the point of observation and the transmitting antenna 14. The time delay is due to the finite velocity of propagation of electromagnetic fields, as is well known from the theory of retarded potential for electromagnetic fields. Suppose that s(t) denotes the transmit signal at any time t at the transmitting antenna 14. Then at the receiving antenna 16, the interference signal will be of the form Ks(t-τ), with K and τ being the amplitude reduction and the time delay, respectively. The medium between transmitter antenna 14 and receiver antenna 16 behaves as a network with a transfer function K/τ. The interference cancellation signal generator 18 is a synthesized network that is designed to have this same transfer function K/τ. A sample of the transmit signal s(t) is fed into the interference cancellation signal generator 18, which generates an interference cancellation signal that is identical to the propagating transmit signal received at the receive antenna 16. A summing stage 20 (typically realized by difference amplifier) subtracts the interference cancellation signal from the signal received at the receive antenna. The resultant signal produced by the summing stage 20, which is labeled the "desired receive signal", is devoid of interference caused by the transmission at the nearby transmitter module (e.g., transmitter 12 and transmit antenna 14). This signal is supplied to the receiver 22 for subsequent signal processing (e.g., demodulation and baseband signal processing).

Ideally, the signal cancellation operations performed the ICS 10 should be completely independent of the characteristics of the transmit signal s(t), such as its amplitude, carrier frequency, type of modulation, degree of modulation, duty cycle and other characteristics.

A key design parameter for the ICS 10 is the selection of K and τ, whose values are never known but must be synthesized with a high degree of accuracy. If the transfer function characteristics (K and τ) of the interference cancellation signal generator 18 are not matched to the natural propagation path of the transmit signal s(t) at any time, there will be a difference of the signals and the output of the summing stage 20 will contain an error signal with the characteristics of transmit signal s(t). In the ICS 10 of FIG. 1, this error signal is cancelled out through a feedback loop provided by a control block 24. Control block 24 cancels out this error by adjusting the transfer function characteristics (amplitude reduction—K, and time delay—τ) of the interference cancellation signal generator 18 via control signals supplied to the interference cancellation signal generator 18.

Typically, the interference cancellation signal generator 18 of FIG. 1 utilizes electrical coaxial delays and electrical control circuits to provide the amplitude reduction and time delay that realize the desired transfer function K/τ. These approaches are limited in the sensitivity of the cancellation by the noise in the electronics and by the electromagnetic interference induced in the coaxial delay in a high power multiple system and multiple frequency environment.

SUMMARY OF THE INVENTION

It is therefore an object of the invention to provide an interference cancellation system that generates an interference cancellation signal with improved sensitivity and thus interference cancellation.

It is another object of the invention to provide an interference cancellation system that is suitable for use in high power multiple system and multiple frequency environments.

It is a further object of the invention to employ electrical-to-optical conversion, a programmable optical delay line that introduces precise time delay in the optical domain, and subsequent optical-to-electrical conversion to thereby introduce precise time delay to an analog signal.

It is a further object of the invention to control such electrical-to-optical conversion and/or such optical-to-electrical conversion to effectuate variable amplitude reduction of the analog signal.

It is also an object of the invention that such electrical-to-optical conversion generates a digital optical signal (e.g., a serial digital bit stream) that is delayed in the optical domain by the programmable optical delay line.

It is an additional object of the invention to provide a programmable optical delay line that has the capability of introducing a large range of high resolution optical delays to an optical signal supplied thereto.

It is still another object of the invention to provide monolithic optoelectronic integrated circuits that provide passive optical waveguides, optical amplification and optical path switching for use in an effective and lower-cost programmable optical delay line.

It is yet another object of the invention to provide monolithic optoelectronic integrated circuits that provide optical amplifiers, a network of passive optical waveguides and directional couplers, and preferably control logic to thereby realize an effective and lower-cost programmable optical delay integrated circuit.

It is another object of the invention to provide delta-sigma modulators/converters that utilize inversion quantum-well channel devices, which are suitable for use in electrical-to-optical conversion process performed by an interference canceling system and in a wide range of other signal processing applications.

In accord with these objects, which will be discussed in detail below, the interference caused by the propagation of a transmit signal transmitted from a transmit antenna to a receive antenna is effectively cancelled by an improved signal cancellation system. The system includes an interference cancellation signal generator that generates a time-delayed and amplitude-reduced representation of said transmit signal. A summing stage is operably coupled to the interference cancellation signal generator and the receive antenna. The summing stage subtracts the time-delayed and amplitude-reduced representation of the transmit signal from a receive signal to substantially cancel the interference. The interference cancellation signal generator preferably includes a novel programmable optical delay line that introduces a variable amount of optical delay to an optical signal derived from said transmit signal in addition to a thyristor-based sigma delta modulator that converts samples of the transmit signal to into a digital signal in the optical domain.

Preferably, the programmable optical delay line includes a plurality of delay sections each providing different resolutions of optical delay (e.g., from course to super-fine).

In addition, the optoelectronic integrated circuits that realize components of the programmable optical delay line and the sigma-delta modulator and demodulator are preferably realized by novel inversion quantum-well channel device structures which monolithically integrate HFETS, bipolar transistors, lasers, detectors, and thyristors.

Additional objects and advantages of the invention will become apparent to those skilled in the art upon reference to the detailed description taken in conjunction with the provided figures.

BRIEF DESCRIPTION OF THE DRAWINGS

FIGS. 3B1 and 3B2 are schematic diagrams of two exemplary optoelectronic circuits that utilize inversion quantum-well channel device structures to realize the first-order sigma-delta modulator of FIG. 3A.

FIG. 3C1 is a pictorial illustration of an exemplary configuration of a heterojunction thyristor-based operational amplifier/high gain amplifier circuit in accordance with the present invention.

FIG. 3C2 is a graph showing the current-voltage characteristics of the thyristor device of FIG. 3C1.

FIG. 3C3 is a graph illustrating representative signal gain of the thyristor device of FIG. 3C1 over varying injector currents.

FIG. 3C4 is a graph showing the current-voltage characteristics of the thyristor device of FIG. 3C1 over varying injector currents that provide a switching voltage near 5 volts and a large inverting open-loop voltage gain (in this simulation, near 300,000).

FIG. 3C5 is a pictorial illustration of an exemplary configuration of the heterojunction thyristor device of FIG. 3C1 configured for differential output.

FIG. 3C6 is a pictorial illustration of another exemplary configuration of a thyristor-based operational amplifier/high gain amplifier circuit in accordance with the present invention.

FIG. 3C7 is an equivalent circuit representation of the thyristor-based operational amplifier/high gain amplifier circuit of FIG. 3C6.

FIGS. 4B1 and 4B2 are schematic diagrams of two exemplary optoelectronic circuits that utilize inversion quantum-well channel device structures to realize the second-order sigma-delta modulator of FIG. 4A.

FIG. 4B3 is a schematic diagram of an exemplary switched-capacitor integrator that is suitable for use at the integration stage 54 of FIGS. 4B1 and 4B2.

FIG. 4B4 is a pictorial illustration of a thyristor-based differential amplifier circuit with unity-gain (or near-unit gain), which is suitable for use in realizing the summing stage 42 (or summing stage 52) of the sigma-delta modulators of the present invention as described herein with respect to FIGS. 3A through 4B3.

FIG. 4B5 is an equivalent circuit representation of the thyristor-based differential amplifier circuit of FIG. 4B4.

FIG. 5B1 is a schematic illustration of the optoelectronic integrated circuits that realize the second section of the programmable optical delay line of FIG. 5A.

FIG. 5B2 is a schematic illustration of the optoelectronic integrated circuit that realizes the third section of the programmable optical delay line of FIG. 5A.

FIGS. 5C1 and 5C2 illustrate a first exemplary inversion quantum-well channel device structure for realizing the directional coupler devices of the optoelectronic integrated circuits of FIGS. 5B1 and 5B2.

FIGS. 5D1 and 5D2 illustrate a second exemplary inversion quantum-well channel device structure for realizing the directional coupler devices of the optoelectronic integrated circuits of FIGS. 5B1 and 5B2.

FIGS. 5E1 and 5E2 are plan views that illustrate the optical switching operation of the directional coupler devices of FIGS. 5C1 through 5C2.

FIG. 6 is a schematic diagram of exemplary optoelectronic components that realize a sigma-delta demodulator, which is suitable for use in conjunction with the sigma-delta modulator as shown in FIGS. 3A-4B3 to carry out the optical-to-electrical conversion operations of the interference cancellation signal generator of FIG. 2.

DETAILED DESCRIPTION OF THE PREFERRED EMBODIMENTS

Figure 1:
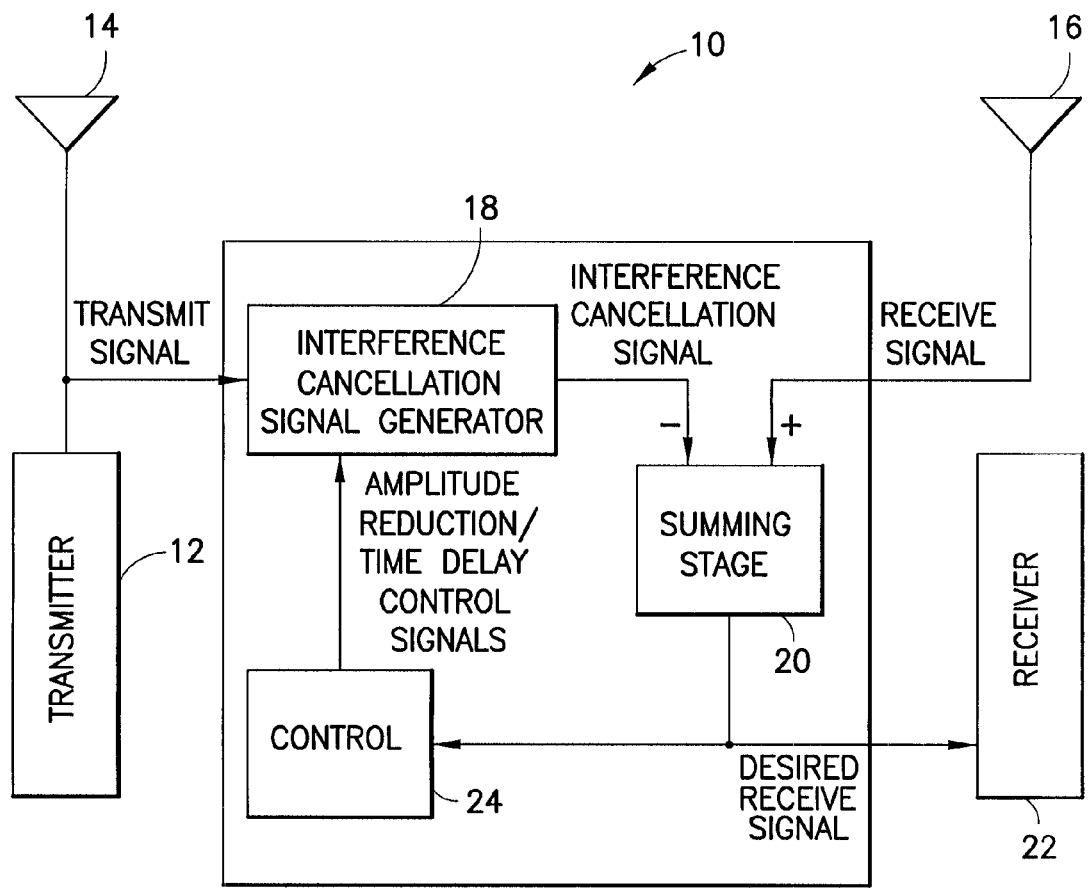
FIG. 1 is a high level functional block diagram of an interference cancellation system in which the inventive components of the present invention may be embodied.
Figure 2:
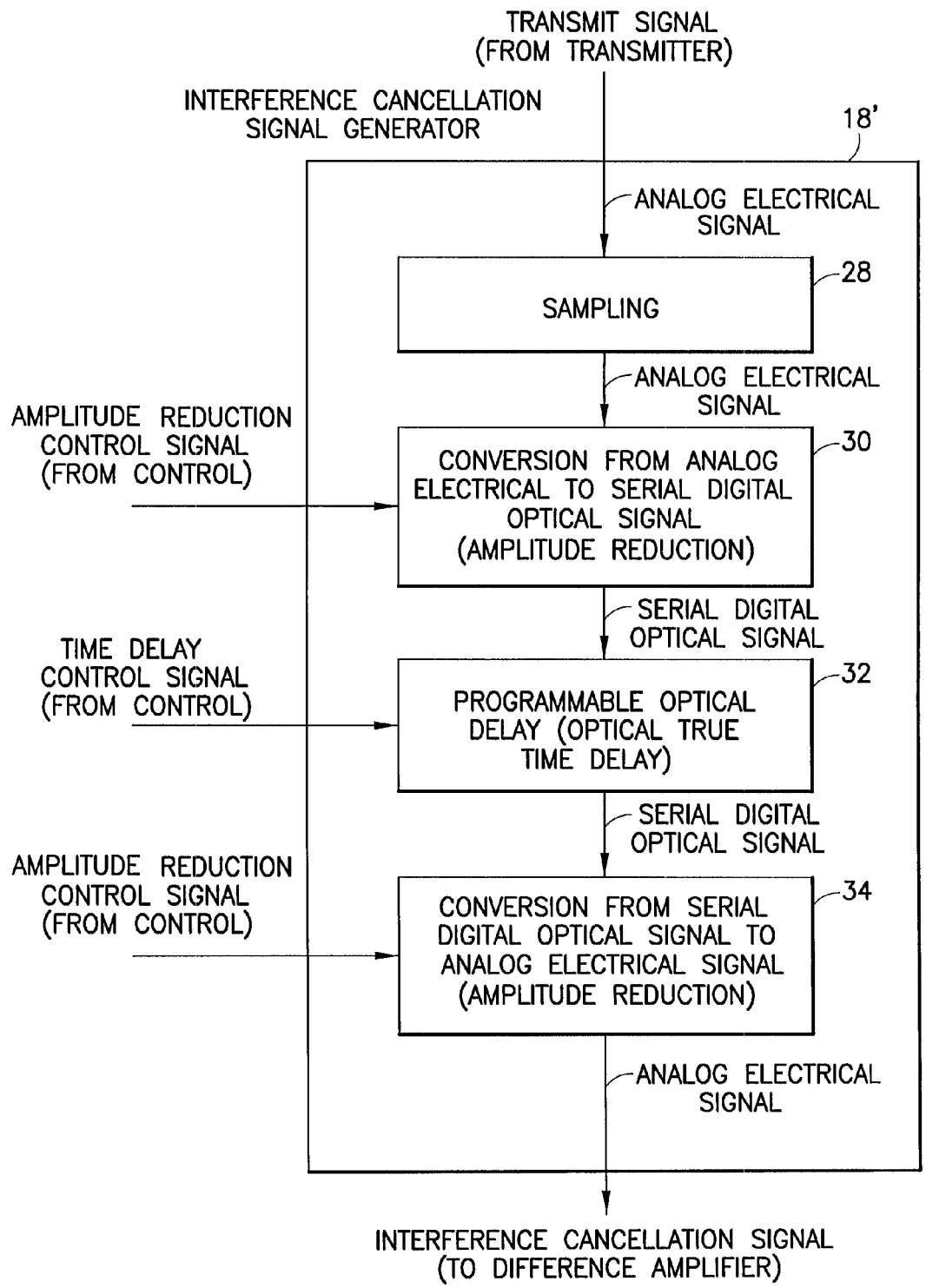
FIG. 2 is a high level functional block diagram of an interference cancellation signal generator of FIG. 1 in accordance with the present invention.

Turning now to FIG. 2, there is shown a high level functional block diagram of an interference cancellation signal generator 18' in accordance with the present invention. The generator 18' effectuates amplitude reduction and time delay to signals derived from samples of the transmit signal to thereby generate the interference cancellation signal in the system of FIG. 1. The generator 18' includes a sampling block 28 that obtains samples of the transmit signal output by the transmitter 10, and normalizes the voltage levels of the samples into a voltage range suitable for use with the circuit block 30. Circuit block 30 subjects the normalized samples of the transmit signal generated by the sampling block 28 to analog-to-digital conversion and electrical-to-optical conversion. This conversion process generates a digital optical signal that represents the transmit signal. The digital optical signal is supplied to the programmable optical delay line 32 to introduce the desired time delay to the digital optical signal. In circuit block 34, the resultant time-delayed digital optical signal is subject to the optical-to-electrical conversion and digital-to-analog conversion, and the resultant analog signal (the interference cancellation signal) is supplied to the summing stage of FIG. 1 to achieve interference cancellation.

The amplitude reduction that is required such that the resultant interference cancellation signal realizes the desired transfer function K/τ may be accomplished in part (or in whole) in conjunction with the analog-to-digital conversion process performed in circuit block 30 and/or in conjunction with the digital-to-analog conversion process performed in circuit block 34. In this configuration, control signals are supplied by the control block 24 to the appropriate signal processing blocks to enable the required amplitude reduction operations. Similarly, the optical time delay introduced to the digital optical signal by the programmable optical delay line 22 is set by the control block 34 such that the resultant interference cancellation signal realizes the desired transfer function K/τ.

Utilizing digital modulation of an optical carrier is advantageous in that it avoids the problems associated with analog modulation of an optical carrier, including difficulties in controlling the optical gain through the programmable optical delay line and the effects of noise and distortion during the electrical-to-optical conversion process and during the optical-to-electrical conversion process.

As shown, the interference signal generator 18' utilizes optical signals and a programmable optical delay line 32 that introduces time delay to these optical signals as part of the process that generates the interference cancellation signal. Through the use of optical communication means as the transport medium, a considerable advantage is realized, due to the reduced size and weight, and the immunity to electromagnetic interference. A programmable optical delay line provides a range of optical paths which are combined through a series of optical switches to produce a programmable optical path length and corresponding programmable optical delay. Advantageously, optical switches eliminate the switching noise effects that characterize delay lines implemented in the electrical domain. Furthermore, the programmable optical delay line 32 is suitable for use at much higher frequencies than electrical delay lines (i.e., the approach is scalable).

Generally, the circuit block 30 performs analog-to-digital conversion of the normalized samples of the transmit signal to generate a sequence of digital words (each word being one or more bits) corresponding thereto, and electrical-to-optical conversion that modulates an optical carrier in accordance with the sequence of digital words to generate an optical signal (in the preferred embodiment, a serial digital optical bit stream) that represents the sequence of digital words. As is well known in the electronic arts, there are many different architectures that may be used to implement the analog-to-digital conversion process, including flash-type converters, sigma-delta converters, time-interleaved converters, folding/interpolated converters, etc. The suitability of a given approach is dependent upon the desired resolution (e.g., number of bits) of the conversion process and the frequency of the signal that is converted. There are also many different mechanisms that are available to modulate an optical carrier in accordance with a sequence of digital words. Typically, such mechanisms include laser drive circuitry that operates under control of control circuitry to modulate a semiconductor laser device to thereby produce the digital optical signal. The suitability of a given mechanism is dependent upon the frequency of the signal that is converted into the optical domain in addition to the desired modulation scheme.

Figure 3A:
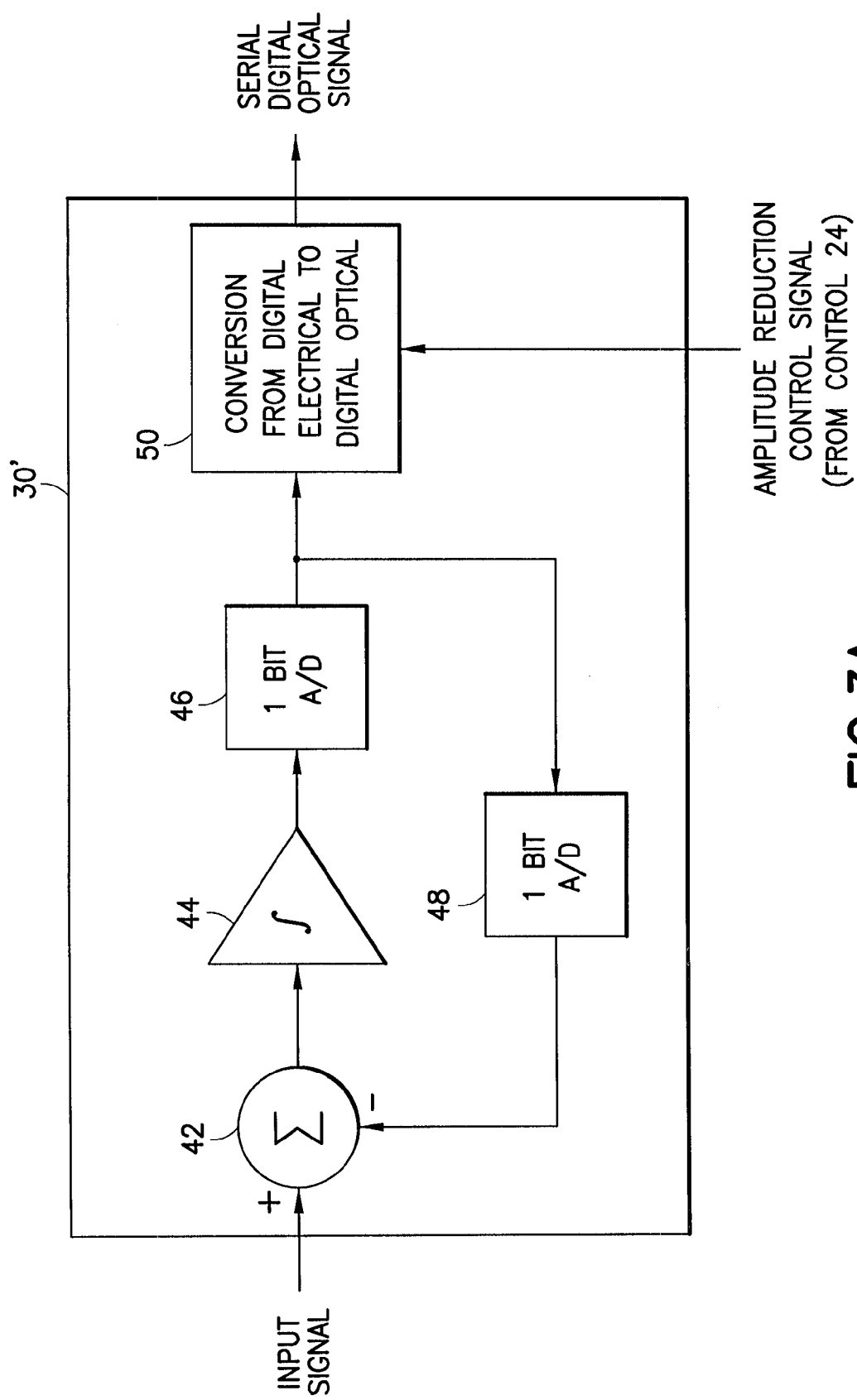
FIG. 3A is a schematic illustration of the architecture of a first-order sigma-delta modulator suitable for use in the interference signal generator of FIG. 2.

According to a preferred embodiment of the present invention, the analog-to-digital conversion operation of circuit block 30 is realized by a sigma-delta modulator. As seen in FIG. 3A, in its most basic form, a sigma-delta modulator 30' includes an integrator 44, a 1-bit analog-to-digital converter (ADC) 46 (also, referred to as a comparator), and a 1-bit digital-to-analog converter (DAC) 48. The output of the DAC 48 is subtracted from the input signal by a summing stage 42. The resultant difference signal is integrated by integrator 44, and the integrator output voltage is converted to a single bit digital output (1 or 0) by the ADC 46. The resulting bit becomes the input to the DAC 48, and the output of the DAC 48 is subtracted from the input signal, etc. This closed-loop process is carried out at a very high "oversampled" rate. The digital data produced by the ADC 46 during this process is a digital bit stream of "ones" and "zeros", and the amplitude of the input signal is proportional to the density of "ones" in the digital bit stream produced by the ADC 46. Note that digital bit stream of "ones" and "zeros" produced by the ADC 46 is modulated onto an optical signal by circuit block 50 to generate a digital optical signal that represents the digital bit stream. This digital optical signal is supplied to the programmable optical delay line to provide the required signal delay operations in the optical domain. Also note that the sigma-delta modulator of FIG. 3A does not include a decimation circuit. The decimation circuit, which is a common component in a sigma-delta converter and typically realized by a high-performance digital signal processor, performs filtering operations and channel conversion from a serial one bit digital signal to an N-bit parallel digital signal (e.g., base 2 bit sequence representation). However, for the interference cancellation application addressed herein, suitable performance of the system can be obtained with lower costs and complexity by avoiding the use of the decimation circuit.

Amplitude reduction may be performed as part of the operations performed by the sigma-delta modulator by varying the optical power level of the optical signal produced at the output of the sigma delta modulator in response to an amplitude reduction control signal supplied thereto as shown.

Two exemplary implementations of the first order sigma-delta modulator of FIG. 3A are shown in FIGS. 3B1 and 3B2, respectively. Importantly, these two implementations utilize heterojunction thyristor devices to perform the following functions:

i) the integration function of integrator 44;

ii) the 1-bit analog-to-digital conversion function of ADC 46, and the electrical-to-optical conversion function of circuit block 50, contemporaneous with one another; and iii) the 1-bit digital-to-analog conversion function of DAC 48.

Details of the structure (and corresponding methods of manufacture) and operation of the heterojunction thyristor devices of FIGS. 3B1 and 3B2 are described in detail in U.S. Pat. No. 6,031,243; U.S. patent application Ser. No. 09/556,285, filed on Apr. 24, 2000; U.S. patent application Ser. No. 09/798, 316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, entitled "Method of Fabricating Semiconductor Devices Employing At Least One Modulation Doped Quantum Well Structure and One or More Etch Stop Layers for Accurate Contact Formation," filed on Jan. 13, 2003; each of these references herein incorporated by reference in its entirety.

The primary advantage of the implementations of FIGS. 3B1 and 3B2 is the simplicity and the high speed switching of the heterojunction thyristor device. Note that the integration operation is comprised of only one heterojunction thyristor device with associated load elements, bias current source, and RIC circuit elements as compared with a transistor-based op-amp (which generally utilizes a large number of devices) and associated R/C circuit elements as is well known in the electronic arts. Also note that the basic 1-bit ADC (e.g., comparator) operation is comprised of only the heterojunction thyristor device and the load element as compared with a transistor-based comparator (which generally utilizes about 15 devices) as is well known in the electronic arts. The switching of the heterojunction thyristor device is expected to be greater than 40 GB/s with 10 µW of input power. If the optical input power is increased, the switching times may be even shorter, since with sufficient input switching power, the finite time to integrate the charge for switching to occur may be effectively eliminated. The ultimate limit upon the switching speed is set by the internal transit times in the device, which is on the order of 2-4 pico seconds. Thus, switching speeds of 50 Gb/s are potentially achievable with current devices.

Turning to FIG. 3B1, the summing stage of the first-order sigma delta modulator 30' is realized by a differential amplifier circuit, which is implemented by a pair of emitter-coupled quantum-well-base heterojunction bipolar transistors Q1 and Q2, current source CS1, and load resistor R1 as shown. The gain of the differential amplifier circuit, which is controlled by the resistance of R1, is set at or near unity to provide a voltage signal at the output node $V_O$ that represents the voltage difference between the input signal at node $V_{IN}$ and the feedback signal provided by the DAC (e.g. HT4).

A resistor R2 is coupled between the output node $V_O$ of the differential amplifier circuit and the negative input node (e.g., n-channel injector terminal) of the heterojunction thyristor-based operational amplifier HT1. A capacitor C1 is coupled in a negative feedback path between the output node (e.g., cathode terminal electrode) and the input node (e.g., n-channel injector terminal) of the heterojunction thyristor-based operational amplifier HT1. The resistor R2 and capacitor C1 are used to configure the heterojunction thyristor-based operational amplifier HT1 as an integration stage whereby the output signal produced at the output node (e.g., cathode terminal electrode) of the heterojunction thyristor-based operational amplifier HT1 is proportional to the integral of the signal supplied from the differential amplifier via resistor R2. Such operation can be represented by the following equation:

$$v_{out}(t) = \frac{-1}{(R2*C1)} \int v_{in} dt$$

where $v_{in}$ is the signal supplied from the output node of the differential amplifier, and $v_{out}$ is the output signal produced at the output node (e.g., cathode terminal electrode) of the heterojunction thyristor-based operational amplifier HT1.

FIGS. 3C1 through 3C7 illustrate the realization of the heterojunction thyristor-based operational amplifier HT1. Such configuration is provided by biasing the thyristor near the point where the device switches into the ON state but below this point such that switching into the ON state is inhibited. In this region, there is a large inverting voltage gain between the n-channel injector terminal and the cathode terminal and between the p-channel injector terminal and the anode terminal. When a single-ended input signal ($V_{in-}$) is supplied to the n-channel injector terminal, the input signal is amplified by the device in accordance with the large inverting open-loop voltage gain (represented by a gain factor of −A) to produce a corresponding amplified single-ended output signal ($V_{out+}$) at the cathode terminal of the device, where $V_{out+} \approx -AV_{in-}$. Similarly, when a single-ended input signal ($V_{in+}$) is supplied to the p-channel injector terminal, the input signal is amplified by the device in accordance with the large inverting open-loop voltage gain to produce a corresponding amplified single-ended signal ($V_{out-}$) at the anode terminal of the device, where $V_{out-} \approx -AV_{in+}$. When a differential input signal ($V_{in+} - V_{in-}$) is supplied to the p-channel injector terminal and the n-channel injector terminal, respectively, the differential input signal is amplified by the device in accordance with the large inverting open-loop voltage gain to produce a corresponding amplified single-ended output signal ($V_{out+}$) at the cathode terminal of the device, where $V_{out+} \approx A(V_{in+}-V_{in-})$, and also produce an amplified single-ended output signal ($V_{out-}$) at the anode terminal of the device with opposite polarity, where $V_{out-} \approx -A(V_{in+}-V_{in-})$. The two output signals ($V_{out+}$ and $V_{out-}$) produced at the cathode terminal and anode terminal of the device can be used to provide a differential output signal ($V_{out+}-V_{out-}$) that represents an amplified version of the differential input signal where $(V_{out+}-V_{out-}) \approx 2A(V_{in+}-V_{in-})$. In this manner, the thyristor-based amplifier device applies a substantially linear open-loop voltage gain to the input signal(s) supplied thereto for output via the output node of the device. Details of the fabrication of such thyristor-based high gain amplifier circuits are set forth in U.S. application Ser. No. (OPE-029), entitled "Heterojunction Thyristor-Based Amplifier", filed concurrently herewith, commonly assigned to assignee of the present invention.

Turning now to FIG. 3C1, there is shown a realization of a thyristor-based operational amplifier/high gain amplifier circuit in accordance with the present invention. Such configuration is provided by coupling the $V_{in-}$ terminal to the n-channel injector terminal of the thyristor device and coupling the $V_{in+}$ terminal to the p-channel injector terminal of the thyristor device. Preferably, a coupling capacitor $C_{c1}$ is disposed between the $V_{in-}$ terminal and the n-channel injector terminal of the thyristor device for DC isolation, and a coupling capacitor $C_{c2}$ is disposed between the $V_{in+}$ terminal and the p-channel injector terminal of the thyristor device for DC isolation as shown. DC bias current levels $J_{inN}$ and $J_{outP}$ are supplied to the n-channel injector terminal and p-channel injector terminal of the device by current sources $CS_N$ and $CS_P$ as shown. A first bias resistance $R_{B1}$ is coupled between a positive potential source (e.g., $V_{DD}$) and the anode terminal of the device. A second bias resistance $R_{B2}$ is coupled between the cathode terminal of the device and a ground potential source (or negative potential source). As shown in FIG. 3C2, the switching voltage at the anode terminal of the device is set by a DC bias line (which is dictated by the resistance of the first bias resistor $R_{B1}$ and the second bias resistor $R_{B2}$) as well as the DC bias current $J_{inN}$ supplied to the n-channel injector terminal and the DC bias current $J_{outP}$ supplied to the p-channel injector terminal. Importantly, the DC bias point is selected such that it is near the point where the device switches into the ON state but below this point such that switching into the ON state is inhibited. This is accomplished with a bias line that intersects the current/voltage curve of the device at only one point, which occurs well below the holding current condition (where the current J is near $J_H$ as shown). Also note that the switching voltage increases when the DC bias current $J_{outP}$ is increased, while the switching voltage decreases when the DC bias current $J_{inN}$ is increased. Preferably, the sources $CS_N$ and $CS_P$ and the bias resistors $R_{B1}$ and $R_{B2}$ are realized with transistor devices (such as p-channel HFETs or n-channel HFETs) that are integrally formed with the thyristor device utilizing a common epitaxial growth structure.

As shown in FIG. 3C3, the DC bias current levels $J_{inN}$ and $J_{outP}$ can be manipulated to define the open loop voltage gain A of the device, which is the ratio of the output voltage level (e.g., the voltage level at the cathode terminal) with respect to input voltage level (e.g., the voltage level at the n-channel injector terminal). Larger open loop voltage gain values are provided by increasing the DC bias current level $J_{inN}$ and/or by increasing the DC bias current level $J_{outP}$. Thus, to configure a heterojunction thyristor device as part of an operational amplifier/high gain amplifier circuit, the DC bias current levels $J_{inN}$ and $J_{outP}$ supplied to the n-channel injector terminal and p-channel injector terminal of the device by current sources $CS_N$ and $CS_P$ are selected to be in correspondence with the desired gain value. In the exemplary configuration shown, an open loop gain A on the order of 300,000 is desired. This is provided by a DC bias current $J_{inN}$ on the order of $2.5 \times 10^{-5}$ A/cm$^2$ and a DC bias current $J_{outP}$ on the order of $4 \times 10^{-3}$ A/cm$^2$, which corresponds to a switching voltage on the order of 5 volts as shown in FIGS. 3C3 and 3C4. The DC bias current levels $J_{inN}$ and $J_{outP}$ may be adjusted to provide for different open loop gain values. For example, a DC bias current $J_{inN}$ on the order of $2 \times 10^{-5}$ A/cm$^2$ and a DC bias current $J_{outP}$ on the order of $4 \times 10^{-3}$ A/cm$^2$ corresponds to a switching voltage on the order of 6.5 volts and an open loop gain of 280,000 as shown in FIGS. 3C3 and 3C4. The bias resistors $R_{B1}$ and $R_{B2}$ are selected such that the DC bias point, which is dictated by the intersection of the bias line and the appropriate current/voltage curve as shown, occurs at (or substantially near) the desired switching voltage level. This is accomplished by identifying the current J through the device which corresponds to the desired switching voltage level. In the exemplary configuration, a current J on the order of $1 \times 10^{-3}$ A/cm$^2$ corresponds to the desired switching voltage level of 5 volts. The bias resistors $R_{B1}$ and $R_{B2}$ are then selected such that the current J corresponding to the desired switching voltage passes through the bias resistance $R_{B1}$ to produce the appropriate voltage drop (e.g., $V_{DD}$ less the desired switching voltage). Thus, in the exemplary configuration shown, the bias resistor $R_{B1}$ is selected such that the current J passing through it produces a voltage drop on the order of $(V_{DD}-5)$ volts. In other words, $R_{B1} \approx (V_{DD}-5)$ volts/$1 \times 10^{-3}$ A/cm$^2$. The value of the bias resistance $R_{B2}$ is chosen according to the desired voltage swing at the output terminals (e.g., the cathode terminal $V_{out+}$ and the anode terminal $V_{out-}$). More specifically, the bias resistance $R_{B2}$ dictates the ratio of the voltage at these output terminals. Because the device is inhibited from switching into the ON/conducting state, the output voltage swing will be limited to how high the current can rise vertically at the switch point as it moves around either side of the switch point (i.e., from some point just below switching to some point just above switching. Therefore, the bias resistances $R_{B1}$ and $R_{B2}$ should be chosen as small as possible without allowing switching. This also reduces the output impedance. As set forth above, the ratio of bias resistances $R_{B1}$ and $R_{B2}$ is the ratio of the voltage level at the output terminals (e.g., the cathode terminal $V_{out+}$ and the anode terminal $V_{out-}$). Typically, this ratio is at or near one (i.e., equal values) unless the design dictates asymmetry. The input impedance is high by virtue of the magnitude of the input currents. With the input current $J_{inN}$ on the order of $5 \times 10^{-5}$ A/cm$^2$, the input impedance of the n-channel injector terminal is extremely high for small devices (e.g., 1 μm by 20 μm). Similarly, with the input current $J_{outP}$ on the order of $2 \times 10^{-3}$ A/cm$^2$, the input impedance of the p-channel injector terminal is be somewhat lower than the n-channel injector terminal but still very high for such small devices.

Advantageously, the thyristor-based high gain amplifier circuit provides the essential characteristics of a typical operational amplifier including:

i) a very large open loop gain such that small non-zero values of $(V_{in+}-V_{in-})$ drives the output voltage $V_{out+}$ to saturation; in other words, if $(V_{in+}-V_{in-})$ is positive, the output voltage $V_{out+}$ will saturate at its positive saturation limit (e.g., at or near $V_{DD}$); if $(V_{in+}-V_{in-})$ is negative, the output voltage $V_{out+}$ will saturate at its negative saturation limit (e.g., at or near ground potential); and ii) the input impedance of the device is very high to minimize signal currents into or out of the $V_{in+}$ and $V_{in-}$ terminals and thus minimize the loading effect on the input signal sources.

Thus, the thyristor-based operational amplifier is suitable for many different signal processing applications such as amplification, filtering, buffering, rectification, threshold detection, and digital switching. In these applications, the thyristor-based operational amplifier may be configured with negative feedback and/or positive feedback. Negative feedback is provided by coupling the $V_{out+}$ output terminal (e.g., the cathode terminal) to the $V_{in-}$ terminal (e.g., the n-channel injector terminal) of the device, while positive feedback is provided by coupling the $V_{out+}$ output terminal (e.g., the cathode terminal) to the $V_{in+}$ terminal (e.g., the p-channel injector terminal) of the device.

In addition, the anode terminal of the thyristor device can be used as the output terminal ($V_{out-}$) of the operational amplifier. In this configuration, the open loop gain of the device is negative whereby $V_{out-}=-A\ (V_{in+}-V_{in-})$ and A is very large. In this configuration, negative feedback is provided by coupling the $V_{out-}$ output terminal (e.g., the anode terminal) to the $V_{in+}$ terminal (e.g., the p-channel injector terminal) of the device, while positive feedback is provided by coupling the $V_{out-}$ output terminal (e.g., the anode terminal) to the $V_{in-}$ terminal (e.g., the n-channel injector terminal) of the device.

The thyristor-based operational amplifier/high gain amplifier circuit as described above with respect to FIGS. 3C1 through 3C4 is configured for singled-ended output. It can also be configured for differential output as shown in FIG. 3C5. In the differential output configuration, the cathode terminal electrode of the device provides the $V_{out+}$ signal, and the anode terminal electrode of the device provides the $V_{out-}$ signal to produce a differential output signal $(V_{out+}-V_{out-}) \approx 2A\ (V_{in+}-V_{in-})$, where A is very large. This configuration is also suitable for many different signal processing applications. In these applications, the thyristor-based operational amplifier/high gain amplifier circuit may be configured with negative feedback and/or positive feedback. Negative feedback is provided by coupling the $V_{out+}$ terminal (e.g., the cathode terminal) to the $V_{in-}$ terminal (e.g., the n-channel injector terminal) of the device, or by coupling the $V_{out-}$ terminal (e.g., the anode terminal) to the $V_{in+}$ terminal (e.g., the p-channel injector terminal) of the device. Positive feedback is provided by coupling the $V_{out+}$ terminal (e.g., the cathode terminal) to the $V_{in+}$ terminal (e.g., the p-channel injector terminal) of the device, or by coupling the $V_{out-}$ terminal (e.g., the anode terminal) to the $V_{in-}$ terminal (e.g., the n-channel injector terminal) of the device.

Figure 6:
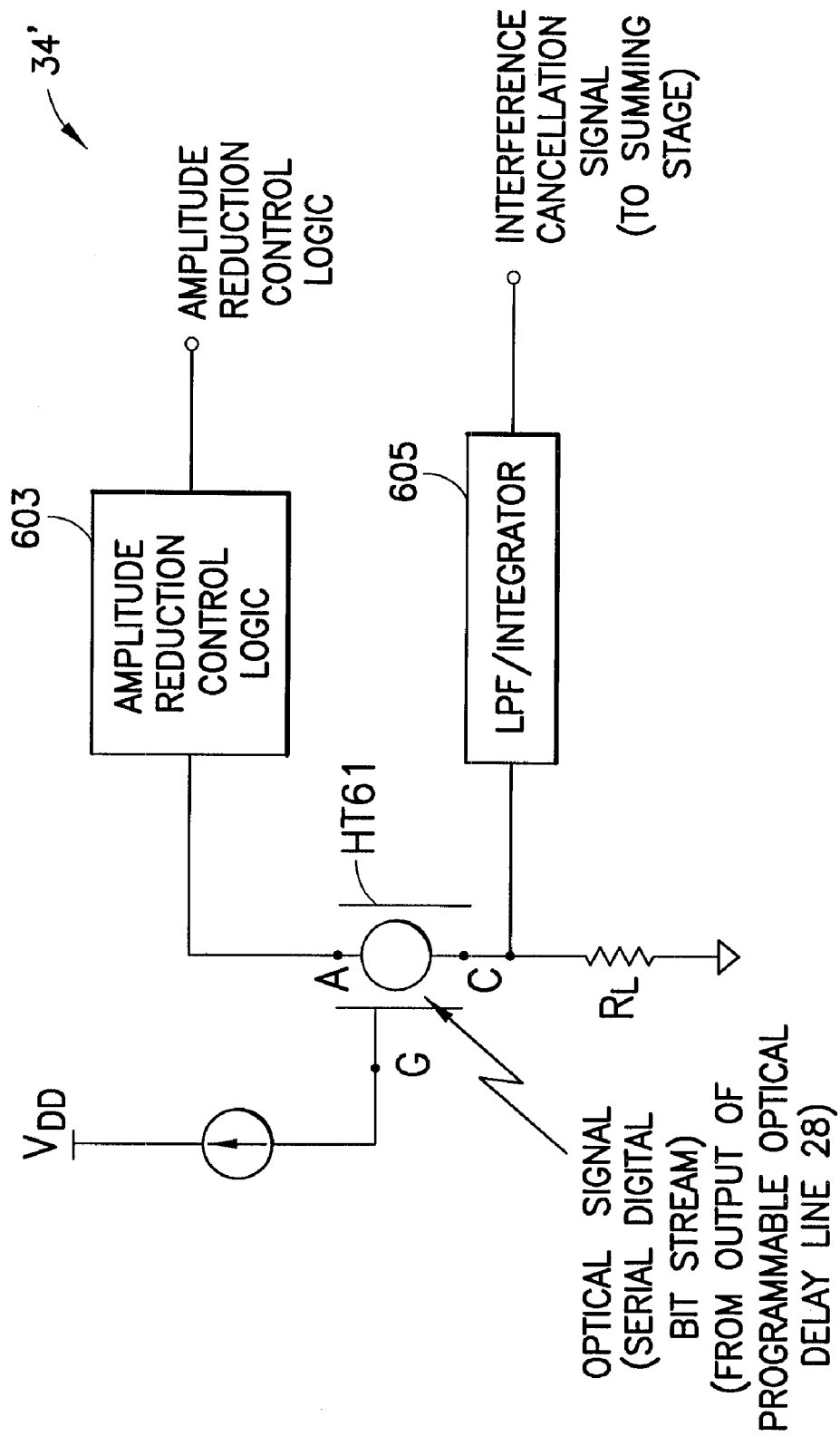

It will be appreciated by those skilled in the art that the output impedance of the thyristor device may be high, which could make the configurations described above unsuitable for applications that require a large output current from the operational amplifier. In these applications, an output buffer stage may be coupled between the output node(s) of the thyristor device (e.g., the cathode terminal and/or the anode terminal) and the output terminal(s) of the operational amplifier circuit (the $V_{out+}$ terminal and/or the $V_{out-}$ terminal of the circuit, which is coupled to the load impedance) as shown in FIGS. 3C6 and 3C7. The output buffer stage minimizes the output impedance of the operational amplifier circuit so that the voltage gain is relatively unaffected by the value of the load impedance. The output buffer stage may be realized by any one of a variety of well-known types of output buffer stages, including an emitter-follower output stage, source-follower output stage or push-pull output stage. The emitter-follower output stage utilizes a bipolar-type transistor configured as an emitter-follower to drive the load impedance. The source-follower output stage utilizes an FET-type transistor configured as a source-follower to drive the load impedance. The push-pull output stage utilizes complementary transistors (which may be bipolar-type transistors or FET-type transistors) that are configured as followers to drive the load impedance. Preferably, the transistor that realize the output buffer stage are quantum-well-base transistors (e.g., n-channel quantum well-base bipolar transistors and/or p-channel quantum well-base bipolar transistors) and/or n-type HFET transistors and/or p-type HFET transistors that are integrally formed with the thyristor device that provides the high gain amplification.

Referring back to FIG. 3B1, the output signal of the integration stage (thyristor-based operational amplifier HT1) is supplied to the p-channel injector terminal of the heterojunction thyristor HT2. The heterojunction thyristor HT2 contemporaneously performs the functions of a 1-bit ADC and optical-to-electrical conversion. More specifically, an electrical sampling clock signal that operates at the oversample frequency synchronizes the operation of heterojunction thyristor HT2. During a sample period, the electrical sampling clock level is high. This high clock level deactivates a thyristor-based sampling device HT3 such that current source CS3 is electrically decoupled from the n-channel injector terminal of heterojunction thyristor HT2. After the sample period, the electrical sampling clock level is low. This low clock level activates the thyristor-based sampling device HT3 such that current source CS3 is electrically coupled to the n-channel injector terminal of heterojunction thyristor HT2. When electrically coupled to the n-channel injector terminal of heterojunction thyristor HT2, the current source CS3 drains charge from the n-channel quantum-well of heterojunction thyristor HT2 to thereby reset the thyristor HT2 into an OFF state. Details of the operation of the thyristor-based sampling device HT3 is set forth in U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; and U.S. patent application Ser. No. 10/323,388, filed on Dec. 19, 2002; incorporated by reference above in their entirety.

During the sample period when the electrical sampling clock level is high and the thyristor-based sampling device HT3 is deactivated, the heterojunction thyristor device HT2 operates contemporaneously to perform the 1-bit ADC function and the electrical-to-optical conversion function. The 1-bit ADC function is provided by sizing the thyristor device HT2 such that it switches into its ON state when the input voltage level supplied thereto exceeds a comparison reference voltage level (which corresponds to the average of the maximum and minimum expected voltage level at the input node $V_{IN}$), and automatically switches into the OFF state when the sampling period ends. Note that during a given sampling period there is a time required for charge to accumulate in the p-type quantum well channel of thyristor device HT2 such that the thyristor device HT2 switches into the ON state when the input voltage level supplied thereto exceeds the comparison reference voltage level. Importantly, this time corresponds to (1/Nyquist frequency of the input signal) for proper operation. Thus, it is important that the sampling period of the sampling clock correspond to (1/Nyquist frequency of the input signal) for proper operation. As described above, when the sampling period ends, the current source CS3 is electrically coupled to the n-channel injector terminal of heterojunction thyristor HT2 to drain charge from the n-channel quantum-well of heterojunction thyristor HT2 and thereby reset the thyristor HT2 into an OFF state.

An on/off voltage signal that corresponds to the ON/OFF state of the thyristor HT2 is generated at the anode terminal of the thyristor HT2. This on/off voltage signal is supplied to a thyristor-based DAC HT4 and controls the operation of the DAC HT4 as follows. When the thyristor HT2 is ON, the thyristor-based DAC HT4 provides a first voltage reference (Vref+) at its cathode terminal, which is supplied to the feedback terminal of the differential amplifier. When the thyristor HT2 is OFF, the thyristor-based DAC HT4 provides a second voltage reference (e.g., Vref−, in this configuration ground potential) at its cathode terminal, which is supplied to the feedback terminal of the differential amplifier. The first and second voltage references generally correspond to the maximum and minimum expected voltage levels at the input node $V_{IN}$. The first voltage reference level (Vref+) produced at the cathode terminal of thyristor HT4 is set by the resistance of R6 and the value of the positive rail voltage supplied to the anode terminal. Details of the operation of the thyristor-based DAC HT4 is set forth in U.S. patent application Ser. No. 10/280,892, filed on Oct. 25, 2002, incorporated by reference above in its entirety.

Note that the heterojunction thyristor device HT2 is biased such that it operates as a lasing device in the ON state. In this manner, the thyristor HT2 provides electrical-to-optical conversion of the serial bit stream identified by its 1-bit ADC function performed during the sampling periods defined by the sampling clock signal. This optical signal, in the form of a serial digital bit stream, is supplied via a fiber waveguide (or other waveguide device) to the programmable optical delay line as described herein. Note that amplitude reduction control can be accomplished by varying the optical power of the optical signal produced by the thyristor device HT2. This is accomplished by amplitude reduction control logic that adjusts (e.g., scales) the positive rail voltage level supplied to the load resistor R4 of thyristor device HT2 and the anode terminal of thyristor device HT4 as shown.

In addition, the integration function performed by the thyristor HT1 can also be described as a low-pass filter whose cutoff frequency corresponds to the integration time period of the integrator. In effect, the integrator/low-pass filter operates to shape quantization noise so that it lies above the pass-band of the low-pass filter realized in the sigma-delta demodulator block described below. In order to control the integration time period/cutoff frequency of the integrator/low pass filter function performed by the thyristor HT1, the duration of the sampling period may be adjusted. Thus, one can vary the duration of the sampling period provided by the electrical sampling clock signal to vary the integration time period/ cutoff frequency of the integrator/low pass filter function performed by the thyristor HT1. Advantageously, this feature can be used to provide different filter characteristics to support the modulation of a wide frequency band of signals.

Turning now to FIG. 3B2, there is shown another implementation of the first-order sigma-delta modulator of FIG. 3A. Note that this implementation is similar to FIG. 3B1, but utilizes an optical sampling clock signal (instead of an electrical sampling clock signal) to selectively activate and deactivate the thyristor-based sampling device HT3'. In addition, the optical signal produced by the thyristor HT2 is used to control the operation of the thyristor-based DAC HT4'. In this configuration, an optical sampling clock signal that operates at the oversample frequency synchronizes the operation of heterojunction thyristor HT2. During a sample period, the optical sampling clock level is low. This low clock level deactivates a thyristor-based sampling device HT3' such that current source CS3 is electrically decoupled from the n-channel injector terminal of heterojunction thyristor HT2. After the sample period, the optical sampling clock level is high. This high clock level activates the thyristor-based sampling device HT3' such that current source CS3 is electrically coupled to the n-channel injector terminal of heterojunction thyristor HT2. When electrically coupled to the n-channel injector terminal of heterojunction thyristor HT2, the current source CS3 drains charge from the n-type quantum-well channel of heterojunction thyristor HT2 to thereby reset the thyristor HT2 into an OFF state. Similarly, the optical signal generated by the thyristor HT2 is used to control the operation of the DAC HT4' as follows. When the optical signal produced by the thyristor HT2 is high (e.g., thyristor HT2 is ON), the thyristor-based DAC HT4' provides a first voltage reference (Vref+) at its cathode terminal, which is supplied to the feedback terminal of the differential amplifier. When the optical signal produced by the thyristor HT2 is off (e.g., thyristor HT2 is OFF), the thyristor-based DAC HT4' provides a second voltage reference (Vref−, in this configuration a ground potential) to the feedback terminal of the differential amplifier. Details of the operation of the optically-controlled thyristor-based sampling device HT3' is set forth in U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; and U.S. patent application Ser. No. 10/323,388, filed on Dec. 19, 2002; incorporated by reference above in their entirety. Details of the operation of the thyristor-based DAC HT4' is set forth in U.S. patent application Ser. No. 10/280,892, filed on Oct. 25, 2002, incorporated by reference above in its entirety. The other components of FIG. 3B2 (e.g., differential amplifier Q1, Q2, CS1, R1, integrating thyristor device HT1 and supporting circuit elements, thyristor device HT2, amplitude reduction control logic) operate in the same manner as described above with respect to FIG. 3B1.

The signal-to-noise ratio and resolution of the first-order sigma-delta converters FIGS. 3A, 3B1 and 3B2 are governed by the sampling rate. Generally, every doubling of the sampling rate improves the signal-to-noise ratio by −9 dB and adds 1.5 bits of resolution. Thus, if a high signal-to-noise ratio and high resolution is desired, a very high sampling rate is required. Such high sampling rates may be unattainable or too costly. Thus, the first-order architecture may not be suitable for many high performance applications.

Figure 4A:
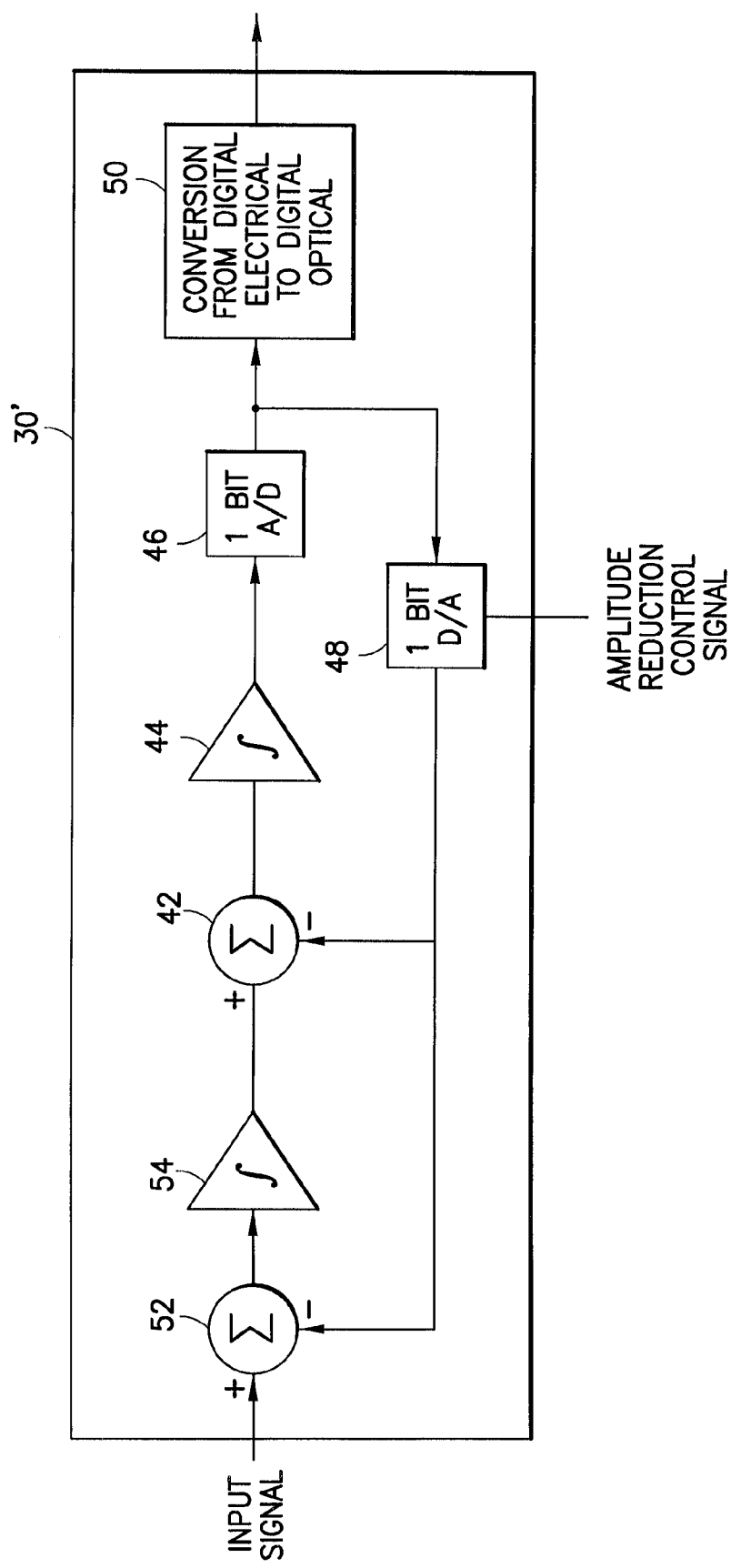
FIG. 4A is a schematic illustration of the architecture of a second-order sigma-delta modulator suitable for use in the interference signal generator of FIG. 2.

In order to improve the signal-to-noise ratio and resolution at a given sampling rate, a higher order sigma-delta converter can be used. Such higher order architectures utilize more than one integrator and summing stage in the modulator. A functional block diagram for a second-order sigma-delta modulator is shown in FIG. 4A. In addition to the summing stage 42, integrator 44, 1-bit ADC 46 and 1-bit DAC 48, it includes a second summing stage 52 and a second integrator 54. This architecture is suitable for applications requiring high-resolution. For example, it has been chosen in an application for modulating a 300 MHz signal that requires a signal to noise ratio of −96 dB and 17-bits of resolution. In this example, the oversampling rate is on the order of 50 GS/s.

Two exemplary implementations of the second order sigma-delta modulator of FIG. 4A are shown in FIGS. 4B1 and 4B2, respectively. Similar to the implementations of FIGS. 3B1 and 3B2, these implementations utilize heterojunction thyristor devices to perform the following functions:

i) the integration function of integrator 54;

ii) the integration function of integrator 44;

iii) the 1-bit analog-to-digital conversion function of ADC 46, and the electrical-to-optical conversion function of circuit block 50, contemporaneous with one another; and iv) the 1-bit digital-to-analog conversion function of DAC 48.

Note that the implementations of FIGS. 4B1 and 4B2 are similar in many respects to that described above with respect to FIGS. 3B1 and 3B2, respectively. Thus, discussion of the common circuit elements will be omitted for simplicity of description. Note that implementation of FIG. 4B1 operates under control of an electrical sampling clock signal to output an optical signal in the form of a serial digital bit stream from thyristor HT2. An electrical digital bit stream, corresponding to the bits of the optical signal, is supplied to a 1-bit DAC HT4 to control the operation of the DAC. However the implementation of FIG. 4B2 operates under control of an optical sampling clock signal to output an optical signal in the form of a serial digital bit stream from thyristor HT2. This optical signal is also supplied to a 1-bit DAC HT4' to control the operation of the DAC HT4'. In both implementations, the DAC (HT4, HT4') operates as follows. When the optical signal produced by the thyristor HT2 is high (e.g., thyristor HT2 is ON), the DAC outputs a first voltage reference (Vref+). When the optical signal produced by the thyristor is off (e.g., thyristor HT2 is OFF), the DAC outputs a second voltage reference (Vref−, in this configuration a ground potential). In both implementations, the voltage reference signal output by the DAC is supplied to the feedback input terminal of the two difference amplifier circuits as shown. One of the difference amplifier circuits realizes the first summing stage 42 and is described above in detail. Another difference amplifier circuit realizes the second summing stage 52 of the second-order architecture. Between the output of the first difference amplifier circuit (second summing stage 52) and the input terminal of the second differential amplifier circuit (first summing stage 42) is an integrator stage 54.

Preferably, the integrator stage 54 of the second-order sigma-delta modulator is realized by a resistor R12, heterojunction thyristor-based operational amplifier HT11, and feedback capacitor C11 as shown. The heterojunction thyristor-based operational amplifier device HT11 is realized in a manner similar to the thyristor-based device HT1 as described above. Note that this configuration is similar to in many respects to the thyristor-based integration stage 44 of the first order sigma-delta converter described above.

In alternate embodiments, the integrator stage 44 of the first-order and second-order sigma delta converter and the integrator stage 54 of the second order sigma delta converter can be realized by a switched-capacitor filter circuit as shown in FIG. 4B3. Note that the switched-capacitor filter requires a two phase clock source (φ1 and φ2) and an operational amplifier (labeled A). For high resolution conversion, the virtual ground input of the amplifier must be excellent in order to maintain proper integration. This demands very high gain. Thus, the thyristor-based operational amplifier as described above may be used. Alternatively, an operational amplifier (which is typically realized by a multistage amplifier) may be used. In order to integrate all of the noise up to the oversample frequency a very high bandwidth amplifier is required. Furthermore, as higher clock rates are required, feedthrough on the switches becomes a significant problem. Thus, for high sampling rates, an optically-controlled thyristor-based sampling switch is preferred. Details of the structure (and corresponding methods of manufacture) and operation of such optically-controlled thyristor-based sampling switch for use in FIG. 4B3 are described in detail in U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002, incorporated by reference above in their entirety. Alternatively, the integrator stage 44 of the first-order and second-order sigma delta converter and integrator stage 54 of the second order sigma delta converter can be realized by an RC network or other integration means as is well known in the electronic arts.

In further embodiments, the summing stage 42 of the first-order and second-order sigma delta converter and the summing stage 52 of the second order sigma delta converter can be realized by a thyristor-based amplifier circuit as shown in FIG. 4B4. This circuit includes a thyristor device configured as a high gain differential amplifier as described above with respect to FIGS. 3C1 through 3C7. A pair of matching resistors (labeled R1) are coupled between the positive (+) and negative (−) inputs and the p-channel injector terminal input and the n-channel injector terminal input, respectively. An additional matching resistor (R1) is added to the positive feedback path between the output anode terminal of the thyristor and the p-channel injector terminal input as shown. This positive feedback configuration provides a differential amplifier at (or near) unity gain such that the small-signal voltage level of the signal generated at the anode terminal represents the difference of the small-signal voltage levels at the positive (+) and negative (−) inputs. An emitter-follower output buffer stage buffers the signal generated at anode terminal to generate an output voltage signal $V_0$ that represents the difference of the small-signal voltage levels at the positive (+) and negative (−) inputs. This output voltage signal $V_0$ is supplied to the integration stage (44/54) that follows in the sigma-delta converter architecture. FIG. 4B5 is an equivalent circuit representation of the thyristor-based differential amplifier circuit of FIG. 4B4.

Figure 5A:
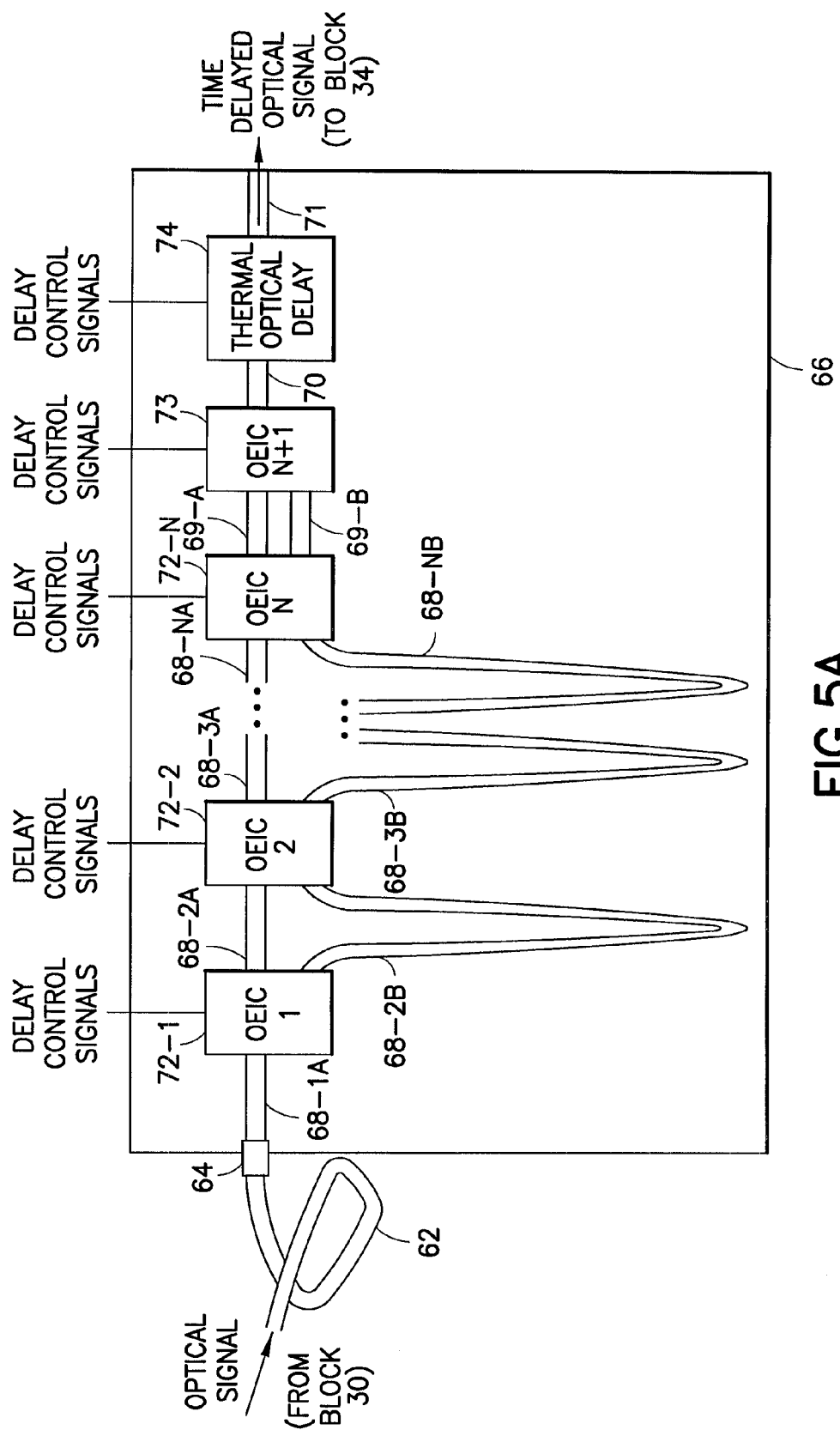
FIG. 5A is a schematic diagram of a 4-section programmable optical delay mechanism in accordance with the present invention, which is suitable for use in the interference signal generator of FIG. 2; the first section is a fixed length of optical fiber or other optical waveguide; the second section is a programmable optical delay path implemented with polymer waveguides patterned onto a printed circuit board with integrated circuit switching nodes; the third section is a programmable optical delay path implemented with a single integrated circuit constructed with passive on-chip waveguides connected to on chip directional couplers; and the fourth section is a programmable optical delay path implemented with a single integrated circuit consisting of a long passive waveguide with thermal control.

Turning now to FIG. 5A, there is shown a preferred embodiment of the programmable optical delay line 32 of FIG. 2. It includes a fiber optic waveguide 62 that is operably coupled to the optical output of block 30 of FIG. 1. The fiber optic waveguide 62 guides the optical signal (e.g., serial digital bit stream) produced by circuit block 30 to a coupler 64 mounted on a printed circuit board (PCB) 66, and imparts a fixed time delay on this optical signal in accordance with its optical path length. A plurality of passive polymer-based optical waveguides (68-1A, 68-2A, 68-2B, 68-3A, 68-3B, ... 68-NA, 68-NB, 69, 70, 71) are integrally formed on the PCB 66 and a series of optoelectronic integrated circuits (72-1, 72-2, ... 72-N, 73, 74) are mounted on the PCB 66 to form an optical delay network that starts at that coupler 64 as shown. The N optoelectronic integrated circuits (72-1, 72-2, ... 72-N) provide optical switching that switches the optical signal from any one its input ports to any one of its output ports. Note that the first optoelectronic integrated circuit 72-1 utilizes only one input port. Thus, the switching function performed by this circuit is limited by this configuration. The optoelectronic integrated circuit 73 (labeled "OEIC N+1") provides a higher resolution variable optical delay path utilizing on-chip passive waveguides and directional couplers similar to the architecture of the PCB 66. Finally, circuit block 74 provides a super-high resolution optical delay path utilizing resistive heating of a passive waveguide. Details of the optoelectronic integrated circuits 72-1 ... 72-N and 73 are described below with respect to FIGS. 5B1 through 5F2.

Preferably, the optoelectronic integrated circuits are mounted at pre-designated positions on the PCB 66 and then the polymer guide material is spun onto the PCB 66. Photolithographic techniques are used to pattern the passive waveguides (68-1A, 68-2A, 68-2B, 68-3A, 68-3B, ... 68-NA, 68-NB, 69, 70, 71) to the edge of the on-chip waveguide in such a way as to achieve the optimum coupling from board waveguide to chip waveguide. Examples of the processing steps that may be used to form the passive polymer-based optical waveguides are described in detail in U.S. Patent Publication 2002/0150368A1 to Imoto, and Tang et al., "Polymer-Based Optical Waveguide Circuits for Photonic Based Array Antennas," Proc. SPIE, Vol. 3632, pp. 250-161, 1999, both herein incorporated by reference in their entirety.

Preferably, the insertion losses (e.g., board to chip and waveguide to device insertion losses) are compensated by the on-chip optical amplifier as described below. This amplifier also compensates for absorption loss in the directional couplers and passive waveguides that are part of the optoelectronic integrated circuits as described below.

In the illustrative embodiment shown, the optical delay network formed on the PCB 66 provides path delays of 0.5 meters down to 1 centimeter, which correspond to time delays of 3.3 nanoseconds down to 66 picoseconds for a polymer index of 2. These delays can practically provide incremental optical delay down to about 50 picoseconds. The optoelectronic circuit 73 provides lengths from 1 centimeter down to 200 μm (corresponding to delays from 50 picoseconds down to 2 picoseconds for a waveguide index of 3.2). All of these delays have a limiting delay resolution represented by the minimum patterned line length. For the last 100 μm of delay (corresponding to delays down to 1 picosecond for a waveguide index of 3.2), analog control of the delay is required. For this purpose, integrated circuit 74 is mounted on the PCB 66. It is simply a length of passive waveguide (in the exemplary implementation up to 1 cm in length) laid out in a serpentine fashion on the chip. The waveguide is located in close proximity to resistive heaters formed by bipolar transistors, FET transistors or other resistive circuit elements. When the resistive heaters are operated at maximum power (under control of a delay control signal supplied thereto), the waveguide is subject to a maximum temperature differential above ambient temperature, which corresponds to a maximum decrease in the refractive index of the waveguide. By this means a small portion of the overall optical delay is an analog time delay controlled by the control signals that govern the power level of the resistive heaters. The precision of this time delay is determined by the ability to adjust and maintain the temperature of the waveguide. For example, if the temperature can be maintained within a narrow temperature range of $T_{desired}$ +/−1° C., the control of the delay can be maintained to an accuracy on the order of 0.04 picoseconds.

Turning now to FIG. 5B1, there is shown a schematic illustration of the elements of each optoelectronic circuit 72-x of FIG. 5A. It includes two input ports 81-A and 81-B and corresponding passive waveguides 82-A and 82-B that guide the optical signal incident at the input ports 81-A, 81-B to optical amplifiers 83-A, 83-B, respectively. The optical amplifiers provide a variable amount of optical gain to the optical signals supplied thereto (under control of control signals supplied thereto) to compensate for insertion losses and absorption losses.

The optical signals output by the optical amplifiers 83-A, 83-B are guided by the passive waveguides 84-A, 84-B to the channel-A input 85-A and channel-B input 85-B of HFET coupler 86, respectively. The HFET coupler 86 has two waveguide channels A and B. Channel A is disposed between the channel-A input 85-A and the channel-A output 87-A. Channel B is disposed between the Channel-B input 85-B and the channel-B output 87-B. The device behaves as a classic directional coupler in which the optical mode in channel A can cross over to channel B (and vice versa) with a certain periodicity in length. This phenomenon is due to evanescent coupling of power that occurs when the two waveguide channels are brought into close proximity. The mode switching of the device is controlled by control signals that are applied to active regions of the device to control the propagation constant of the waveguides. By varying the propagation constant of the waveguides, the number of evanescent couplings within the length of the device can be controlled. When one evanescent coupling occurs during the length of the device, the optical mode in channel A crosses over to channel B and vice versa (e.g., the optical mode in channel B crosses over to channel A). However, when two evanescent couplings occur during the length of the device, the mode in channel A remains in channel A, and the mode in channel B remains in channel B. In this manner, the control signals supplied to the HFET coupler 86 controls the optical path of the optical signal passing through the device whereby the input optical signal (which may be provided at channel-A input 85-A or the channel-B input 85-B) is selectively output to either the channel-A output 87-A or channel-B output 87-B in response to these control signals. Preferably, the HFET coupler device 86 is formed from an inversion quantum-well channel device structure described below with respect to FIGS. 5C1 through 5F2. Passive waveguides 88-A and 88-B guide the optical signals output from the corresponding channel-A output 87-A and channel-B output 87-B to two output ports 89-A, 89-B as shown.

Turning now to FIG. 5B2, there is shown a schematic illustration of the elements of the optoelectronic circuit 73 of FIG. 5A. It includes two input ports 91-A and 91-B and corresponding passive waveguides 92-A and 92-B that guide the optical signal incident at the input ports 91-A, 91-B to optical amplifiers 93-A, 93-B, respectively. The optical amplifiers provide a variable amount of optical gain to the optical signals supplied thereto (under control of control signals supplied thereto) to compensate for insertion losses and absorption losses.

The optical signals provided by the optical amplifiers 93-A, 93-B are output to a plurality of passive waveguides (94-1A, 94-2A, 94-2B, 94-3A, 94-3B, . . . 94-MA, 94-MB, 95) and a series of HFET coupler devices (96-1, 96-2, . . . 96-M) that are integrally formed as part of integrated circuit 73. Similar to the delay architecture of the PCB 66 of FIG. 5A, these elements form an optical delay network that starts at the output of the optical amplifiers 93-A, 93-B as shown. As described above with respect to FIG. 5B1, the HFET couplers (96-1 . . . 96-M) provide optical switching that switches the optical signal from any one its input ports to any one of its output ports in response to control signals supplied thereto. Note that the last HFET coupler 96-M utilizes only one output port. Thus, the switching function performed by this device is limited by this configuration. Preferably, the HFET coupler devices (96-1 . . . 96-M) are formed from an inversion quantum-well channel device structure described below with respect to FIGS. 5C1 through 5F2.

Preferably, the passive waveguides, optical amplifiers and the HFET coupler(s) of the optoelectronic circuits of FIGS. 5A, 5B1, and 5B2 are realized from the inversion quantum-well channel device structures as described in detail in U.S. Pat. No. 6,031,243; U.S. patent application Ser. No. 09/556, 285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, entitled "Method of Fabricating Semiconductor Devices Employing At Least One Modulation Doped Quantum Well Structure and One or More Etch Stop Layers for Accurate Contact Formation," filed on Jan. 13, 2003; incorporated by reference above in their entirety. With these structures, a single fabrication sequence is used to make all the devices, including the electrical devices (e.g., transistors) and the optoelectronic devices (e.g., laser/detector/modulator). In other words, a single set of n type and p type contacts, critical etches, dielectric depositions etc. are used to realize all of these devices simultaneously. The essential features of this device structure include 1) a modulation doped quantum well interface, 2) a refractory metal gate/emitter contact, 3) self-aligned channel contacts formed by ion implantation, 4) n-type metal contacts to the n-type ion implants and the bottom n-type layer, and 5) p-type metal contacts to the p-type layers.

Optical devices are created from these structures by separating the metal gate into two sections which are connected electrically by the P+ layer along the top surface. By depositing a top dielectric mirror over the device structure, a waveguide is formed with an optical mode centered near the modulation doped quantum well channel. The state of the charge in the modulation doped quantum well channel is controlled by the bias applied between the gate terminal and a source terminal electrically coupled to the quantum well channel. If a sufficient positive bias is applied between the gate terminal and the source terminal, gate conduction injects charge the channel. On the other hand, if a zero bias (or other bias condition that does not cause gate conduction) is applied between the gate terminal and the source terminal, there is negligible gate conduction and the channel charge controls the absorption edge in the device. Basically, the injection of charge inhibits the absorption of photons over an energy range corresponding to the filling of the electron states in the conduction band. This is the role of the optical modulator and it forms the basis for the HFET coupler device described herein. More specifically, in order to realize the HFET coupler device, the modulator is expanded to include two parallel waveguide channels which are separated by a narrow passive region.

FIGS. 5C1 through 5F2 illustrate two exemplary implementations of the HFET coupler device realized in inversion quantum-well channel device structures. FIG. 5C1 illustrates an HFET coupler realized from the device structure of FIG. 5C2. FIG. 5D1 illustrates an HFET coupler realized from the device structure of FIG. D2. Both devices include two elliptical waveguide modes that form the two channels A and B of the device as shown. These elliptical modes are centered near the n-type quantum well channel of the respective structure (layer 124 in FIGS. 5C1 and 5C2, and layers 1163b, 1162, 1161, 1160b, 1160a in FIGS. 5D1 and 5D2). First and second N-type implants (labeled 132 and 134 in FIG. 5C1, and labeled 1170 and 1175 in FIG. 5D1) are used to form a contact to the n-type quantum well channel region of the two channels A and B as shown. Metal layers (not shown) are deposited on the first n-type implants to form the source terminal electrodes for the two channels A and B (labeled 140A, 140B in FIG. 5C1 and labeled 1140A, 1140B in FIG. 5D1). The gate terminal electrodes for the two channels A and B (labeled 138A, 138B in FIG. 5C1 and 1138A, 1138B in FIG. 5D1) are deposited on a P+ layer (layer 130 in FIGS. 5C1 and 5C2 and layer 1165B in FIGS. 5D1 and 5D2). Note that a narrow passive region (labeled 136 in FIG. 5C1 and labeled 1176 in FIG. 5D1) separates the two channels A and B. This passive region blocks the flow of charge between (e.g., electrically disconnects) the quantum-well structure in channel A and channel B. In addition, the gate electrodes for the two channels A and B are not electrically connected because the P+ layer (layer 130 in FIGS. 5C1 and 5C2 and layer 1165B in FIGS. 5D1 and 5D2) is removed in the region above the passive region.

The HFET coupler device structures of FIGS. 5C1 and 5D1 operate as a beta coupler switching device as illustrated in the plan view shown in FIGS. 5E1 and 5E2. Note that there are two elliptical modes, corresponding to the two channels A and B of the device. When a sufficient positive forward bias is applied between the gate terminal and the source terminal of one channel such that gate conduction injects charge into only the one channel and not the other channel (e.g., by applying a sufficient positive forward bias between the gate terminal and the source terminal of channel A such that gate conduction injects charge into only channel A and not into channel B), there is a $\Delta\beta$ introduced between the propagation constants of the two channels A and B. By varying the propagation constant of the two channels A and B, the number of evanescent couplings within the length of the device can be controlled. When one evanescent coupling occurs during the length of the device, the optical mode in channel A crosses over to channel A (labeled "BA" in FIG. 5E2). However, when two evanescent couplings occur during the length of the device, the mode in channel A remains in channel A (labeled "AA" in FIG. 5E1), and the mode in channel B remains in channel B (labeled "BB" in FIG. 5E2). In this manner, the control signals supplied to the HFET coupler controls the optical path of the optical signal passing through the device whereby the input optical signal (which may be provided at channel-A input or the channel-B input) is selectively output to either the channel-A output or channel-B output in response to these control signals.

Exemplary voltage levels for the realizing the switching modes shown in FIGS. 5E1 and 5E2 is shown in the table below:

| Input Channel | Output Channel | Gate A Bias Voltage (volts) | Source A Bias Voltage (volts) | Gate B Bias Voltage (volts) | Source B Bias Voltage (volts) |
|---|---|---|---|---|---|
| A | A | 1.6 | 0 | 0 | 1.6 |
| A | B | 0 | 1.6 | 0 | 1.6 |
| B | A | 0 | 1.6 | 0 | 1.6 |
| B | B | 1.6 | 0 | 0 | 1.6 |

Preferably, these control are provided by HFET transistors integrated with the HFET coupler device. By this means, it is possible to provide integrated logic circuits which can perform the decode function on a digital word. Therefore the capability offered by the technology is the integration of very small (on the order of 100-300 µm in length) directional couplers interfacing to on-chip passive waveguides and integrated together with optical amplifiers and HFET electronic devices. Within a chip on the order of 2 mm×2 mm, it is straightforward to integrate HFET logic circuits, HFET directional coupler switches, passive waveguide input and output sections and HFET optical amplifiers.

Preferably, the P+ contact layer (layer 130 in FIGS. 5C1 and 5C2 and layer 1165B in FIGS. 5D1 and 5D2) is selectively removed to electrically decouple the gate terminal electrodes for the two channels A and B by forming a dielectric layer over the P+ contact layer and the gate electrode metal layer. A window is defined by photolithography and etching that extends laterally between the two waveguide channel regions A and B and that extends down through dielectric layer and the P+ contact layer. Preferably, the narrow passive region (labeled 136 in FIG. 5C1 and 1176 in FIG. 5D1) that separates the two channels A and B is then formed using impurity free vacancy disordering (IFVD). More specifically, an oxide layer (e.g., $SiO_2$) is deposited such that it covers the window. The next step is a rapid thermal annealing operation. In this step, the window region covered with the oxide layer experiences Impurity Free Vacancy Disordering (IFVD). Note that the regions outside the window and covered with the dielectric layer show essentially no effects of IFVD. Such vacancy disordering produces a disorder region that blocks to the flow of charge between the channels A and B due to the increased band gap in this region. Advantageously, this process allows the passive region to be very narrow (on the order of 1 micron). This allows the two channels A and B to be located in close proximity to one another, which provides improved evanescent coupling strength. This improved evanescent coupling strength enables the evanescent transfer between channels to take place over a much shorter distance, thereby enabling smaller devices and improved integration capabilities with other HFET coupling devices, HFET logic devices or other electronic and/or optoelectronic devices. Details of similar HFET coupler device structures is set forth in International Application No. PCT/US02/06802, which was filed on Mar. 4, 2002 and published as WO 02/071490 on Sep. 12, 2002, incorporated by reference above in its entirety.

To summarize the preferred implementation of the programmable optical delay line as described above with respect to FIGS. 5A through 5E2, it can logically be broken down into four delay sections. Delay section 1 is the a fixed length of optical fiber or other optical waveguide. Delay section 2 is a programmable optical delay path implemented with polymer waveguides patterned onto a printed circuit board with integrated circuit switching nodes. Delay section 3 is a programmable optical delay path implemented with a single integrated circuit constructed with passive on-chip waveguides connected to on chip directional couplers. Section 4 is a programmable optical delay path implemented with a single integrated circuit consisting of a long passive waveguide with thermal control. All of the delays with the exception of the fiber itself are controlled electronically. One of the advantages of this time delay architecture is that utilizes directional coupler switches that are digitally controlled. Moreover, the operation of the directional coupler devices is relatively temperature insensitive. More specifically, temperature variations will cause slight changes from full transmission which can only affect the amplitude, and since the preferred transport is digital optical, slight amplitude variations should be of no consequence.

Alternate implements of the programmable optical delay line may be used. For example, multiple optical fiber lengths may be connected by directional couplers. An example of such a system is explained in detail in T. L. Smith et al., "Polarization Independent LiNbO3 2×2 Reverse Delta Beta Directional Coupler Optical Switch," PSAA-6 Technical Program, Mar. 4, 1996, Naval Postgraduate School, herein incorporated by reference in its entirety. These implementations tend to be a bulky because the coupling devices are not integrated with the waveguide. Also, the coupling devices are typically several mm in length for effective switching. In addition, high switching voltages of 15V are required due to the requirement of strict TM polarization.

Another alternate implementation may utilize polymer waveguides (as described above) with grating output couplers at each switching node. An example of such a system is described in detail in Tang et al., "Polymer-Based Optical Waveguide Circuits for Photonic Based Array Antennas," Proc. SPIE, Vol. 3632, pp. 250-161, 1999, incorporated by reference above in its entirety. In this system, a 10 m length of polymer waveguide is spun onto a printed circuit board (PCB) and defined by photolithography. The delay line lengths are determined by grating output couplers that divert light into resonant photodetectors for conversion back to the electrical domain.

Turning now to FIG. 6, there is shown an exemplary implementation of the circuit block 34 of FIG. 2. This circuit 34' realizes a sigma-delta demodulator. It includes a heterojunction thyristor device HT61 that is configured to operate as a photoreceiver that converts the optical signal in the form of a serial digital bit stream (e.g., a series of digital pulses) output by the programmable optical delay line 28 into the electrical domain (e.g., a series of digital pulses in the electrical domain). This series of digital electrical pulses is produced at the anode terminal of the thyristor device HT61. Since the thyristor device HT61 reshapes and amplifies the signal, any amplitude loss is of no consequence. Details of the configuration and operation of the thyristor-based photoreceiver HT61 for use in FIG. 6 are described in detail in U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002, incorporated by reference above in their entirety. The amplitude of the electrical output of the thyristor device HT61 at the anode terminal is controlled by the amplitude reduction control logic 603 in response to an amplitude reduction control signal supplied thereto. This amplitude is controlled to scale the signal for the optical cancellation by the control block 24. The electrical digital pulse train output at the anode terminal of the thyristor device HT61 is supplied to a low pass filter (LPF)/integrator 605. Stage 605 provides an low pass filter function that rejects all of the high frequency noise (above the Nyquist value) and an integrator function that produces an analog signal whose voltage level is the average of its input voltage level. Preferably, the low pass filter (LPF)/integrator 605 is realized by a thyristor-based integration stage as described above with respect to FIGS. 3B1 through 3B4, or a switch-capacitor integrator as described above with respect to FIG. 4B3. Alternatively, the low pass filter (LPF)/integrator 605 may be realized by an RC network or other low pass filter/integration means as is well known in the electronic arts. The output of the low pass filter (LPF)/integrator 605 is the interference cancellation signal, which is supplied to the summing stage 20 of FIG. 1 for interference cancellation.

Figure 7A:
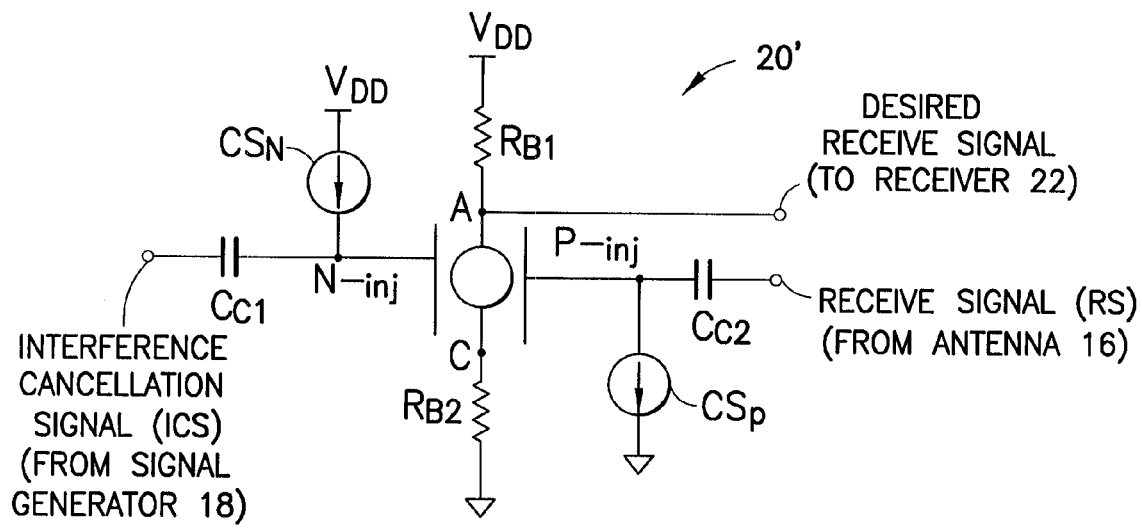
FIG. 7A is a pictorial illustration of a thyristor-based differential amplifier circuit, which is suitable for use in realizing the summing stage 20 of the interference cancellation system of the present invention.
Figure 7B:
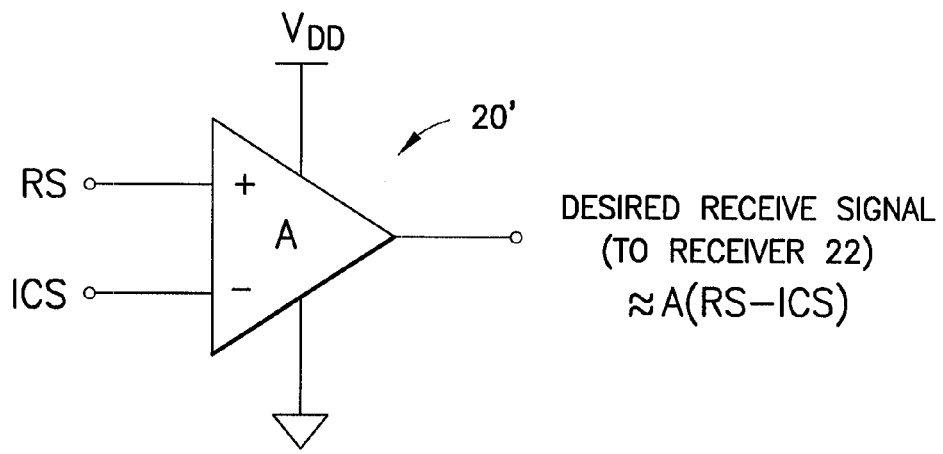
FIG. 7B is an equivalent circuit representation of the thyristor-based differential amplifier circuit of FIG. 7A.

Turning now to FIG. 7A, there is shown an exemplary implementation of the summing stage 20 of FIG. 1. This circuit 20' is realized by a thyristor-based differential amplifier as described above with respect to FIGS. 3C1 through 3C7. The received signal (RS) supplied by the antenna 16 is supplied to the positive (+) input/p-channel injector terminal input of the device, and the interference cancellation signal (ICS) generated by the signal generator 18 is supplied to the negative (−) input/n-channel injector terminal input of the device. The output signal generated by the thyristor-based differential amplifier, which represents the desired receive signal, is taken from the anode terminal. This output signal is supplied to the receiver 22 for receive signal processing. FIG. 7B is an equivalent circuit representation of the thyristor-based differential amplifier circuit of FIG. 7A.

The problem of interference cancellation in a communication system has been described and a solution using optoelectronic integrated circuits and optical time delay has been described. The optoelectronic integrated circuits are preferably realized by novel inversion quantum-well channel device structures which monolithically integrates HFETS, bipolar transistors, lasers, detectors, and thyristors. The key parameters to be controlled are the amplitude reduction and the timing of a feed-forward transmitter signal that is used at the low noise amplifier input for cancellation. The timing is implemented with a digital/analog optical delay line that provides true time delay. The variable delay is achieved with multiple waveguide sections interconnected with optical switches which are controlled with on chip electronics. The switch settings are selected to adjust the delay to the specific transmitter/LNA combination. Control over the amplitude of the feedforward signal is preferably achieved through the use of a single bit sigma delta modulator/demodulator and summation circuit. A conversion rate of 50 GS/s is made possible with the use of a novel thyristor-based 1-bit ADC (e.g., comparator) and a thyristor-based DAC (e.g., sampling circuit). It is expected that improved accuracy in cancellation, which is on the order of −50 dB, can be achieved.

Note that the thyristor-based sigma-delta modulators described herein may be used to realize a sigma-delta converter with the addition of a decimation circuit operably coupled to the electrical output of the 1-bit thyristor-based ADC. In this configuration, it is not necessary that the 1-bit thyristor-based ADC (e.g., HT1) be biased to operate as a laser in the on state as described above. This sigma-delta converter is useful in many different signal processing applications. Also note the board-based and chip-based optical delay mechanisms described herein are useful in many other electronics applications.

There have been described and illustrated herein several embodiments of a interference cancellation system and components utilized therein. While particular embodiments of the invention have been described, it is not intended that the invention be limited thereto, as it is intended that the invention be as broad in scope as the art will allow and that the specification be read likewise. Thus, while particular circuit architectures and circuit elements have been disclosed, it will be understood the others can be used as well. In addition, while particular device structures have been disclosed, it will be appreciated that others can be used as well. It will therefore be appreciated by those skilled in the art that yet other modifications could be made to the provided invention without deviating from its spirit and scope as claimed.

What is claimed is:

1. An integrated circuit comprising:
   a network of on-chip passive waveguides and two-channel directional couplers, each respective two-channel directional coupler employing evanescent coupling for switching of optical signals between two channels through the respective directional coupler, said two-channel directional couplers realized from a plurality of layers formed on a substrate, said layers comprising at least one modulation doped quantum well structure.

2. An integrated circuit according to claim 1, wherein:
   optical signals are selectively switched between the two channels through a given directional coupler based upon voltage levels applied to gate and source terminals for said given directional coupler.

3. An integrated circuit according to claim 2, wherein:
   said two channels through a given directional coupler are separated by a narrow passive region formed via impurity free vacancy disordering.

4. An integrated circuit according to claim 1, further comprising:
   at least two optical amplifiers, operably coupled to said network, said optical amplifiers realized from said plurality of layers formed on said substrate.

5. An integrated circuit according to claim 1, wherein:
   said on-chip passive waveguides include first segments and second segments that extend between respective pairs of directional couplers, wherein said first segments have a first optical path length and said second segments have a second optical path length, said first optical path length significantly smaller than said second optical path length.

6. An integrated circuit according to claim 5, wherein:
   said first segments extend in a substantially linear fashion.

7. An integrated circuit according to claim 5, wherein:
   said second segments extend in a substantially U-shaped fashion.

8. An integrated circuit according to claim 1, wherein:
   said layers include two complementary-type modulation doped quantum well structures vertically spaced apart from one another.

9. An integrated circuit according to claim 8, wherein:
   said two complementary-type modulation doped quantum well structures comprise an n-type modulation doped quantum well structure formed below a p-type modulation doped quantum well structure.

10. An integrated circuit according to claim 9, wherein:
    said layers include an undoped spacer layers disposed between said n-type modulation doped quantum well structure formed below a p-type modulation doped quantum well structure.

* * * * *